United States Patent
Usui et al.

(10) Patent No.: US 9,059,334 B2
(45) Date of Patent: Jun. 16, 2015

(54) POWER SEMICONDUCTOR MODULE AND METHOD OF MANUFACTURING THE SAME

(75) Inventors: Osamu Usui, Tokyo (JP); Naoki Yoshimatsu, Tokyo (JP); Masao Kikuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/617,048

(22) Filed: Sep. 14, 2012

(65) Prior Publication Data
US 2013/0181228 A1  Jul. 18, 2013

(30) Foreign Application Priority Data

Jan. 18, 2012  (JP) .................................. 2012-008083

(51) Int. Cl.
*H01L 29/15*  (2006.01)
*H01L 23/495*  (2006.01)
(Continued)

(52) U.S. Cl.
CPC ....... *H01L 24/97* (2013.01); *H01L 2224/48247* (2013.01); *H01L 2224/49175* (2013.01); *H01L 2224/73265* (2013.01); *H01L 23/4334* (2013.01); *H01L 23/49541* (2013.01); *H01L 23/49575* (2013.01); *H01L 2224/48091* (2013.01); *H01L 2924/13091* (2013.01); *H01L 2924/13055* (2013.01); *H01L 2924/10253* (2013.01); *H01L 2224/40139* (2013.01); *H01L 23/3107* (2013.01); *H01L 24/33* (2013.01); *H01L 24/40* (2013.01); *H01L 24/73* (2013.01);
(Continued)

(58) Field of Classification Search
CPC ..................... H01L 23/4334; H01L 23/49541; H01L 23/49575

USPC ...................... 257/77, 712, 691, 675, E25.06, 257/E25.016, E23.08, E21.499; 438/107
See application file for complete search history.

(56) References Cited

U.S. PATENT DOCUMENTS 6,448,645 B1 *  9/2002  Kimura et al. ................. 257/735
6,703,707 B1 *  3/2004  Mamitsu et al. .............. 257/718
(Continued)

FOREIGN PATENT DOCUMENTS

CN  1790692 A  6/2006
CN  1992259 A  7/2007
(Continued)

OTHER PUBLICATIONS

"Connecting with Copper is connecting with Trust"; Copper Development Association; www.copper.org; downloaded on Nov. 25, 2014.
(Continued)

*Primary Examiner* — Long K Tran
*Assistant Examiner* — Dzung Tran
(74) *Attorney, Agent, or Firm* — Studebaker & Brackett PC

(57) ABSTRACT

First chip main surfaces of first semiconductor chips are bonded to a heat spreader, and second chip main surfaces of the first semiconductor chips are bonded to a first electrode. First chip main surfaces of second semiconductor chips are bonded to a heat spreader, and second chip main surfaces of the second semiconductor chips are bonded to a first electrode. A plurality of electrodes are provided by a lead frame. An insulating member is provided on a side opposite to the chips when viewed from the heat spreader. An insulating substrate is provided on a side opposite to the chips when viewed from the first electrodes.

11 Claims, 24 Drawing Sheets

(51) Int. Cl.
  *H01L 23/52* (2006.01)
  *H01L 21/00* (2006.01)
  *H01L 23/00* (2006.01)
  *H01L 23/433* (2006.01)
  *H01L 23/31* (2006.01)
  *H01L 21/56* (2006.01)

(52) U.S. Cl.
  CPC ............... *H01L 2224/32245* (2013.01); *H01L 2224/33181* (2013.01); *H01L 2224/45124* (2013.01); *H01L 2224/73215* (2013.01); *H01L 2224/40247* (2013.01); *H01L 2224/73213* (2013.01); *H01L 21/561* (2013.01); *H01L 24/29* (2013.01); *H01L 24/32* (2013.01); *H01L 24/37* (2013.01); *H01L 24/45* (2013.01); *H01L 24/48* (2013.01); *H01L 24/49* (2013.01); *H01L 24/92* (2013.01); *H01L 2224/06181* (2013.01); *H01L 2224/291* (2013.01); *H01L 2224/92246* (2013.01); *H01L 2224/92247* (2013.01); *H01L 2224/97* (2013.01); *H01L 2924/10272* (2013.01); *H01L 2924/1203* (2013.01); *H01L 2224/3755* (2013.01); *H01L 2224/73221* (2013.01); *H01L 2924/014* (2013.01); *H01L 2924/1306* (2013.01); *H01L 2924/1305* (2013.01)

(56) References Cited

U.S. PATENT DOCUMENTS

| | | | |
|---|---|---|---|
| 7,456,492 | B2 | 11/2008 | Mochida |
| 7,642,640 | B2 | 1/2010 | Shinohara |
| 7,944,045 | B2 | 5/2011 | Noritake et al. |
| 8,829,534 | B2 | 9/2014 | Kikuchi |
| 2003/0132530 | A1* | 7/2003 | Teshima et al. ............... 257/780 |
| 2004/0179341 | A1* | 9/2004 | Kimoto et al. ............... 361/704 |
| 2006/0091512 | A1 | 5/2006 | Shinohara |
| 2007/0145540 | A1* | 6/2007 | Mochida ....................... 257/659 |
| 2007/0216013 | A1 | 9/2007 | Funakoshi et al. |
| 2008/0054439 | A1* | 3/2008 | Malhan et al. ............... 257/690 |
| 2009/0224398 | A1* | 9/2009 | Noritake et al. ............... 257/707 |
| 2011/0291106 | A1 | 12/2011 | Kikuchi |

FOREIGN PATENT DOCUMENTS

| | | |
|---|---|---|
| CN | 101136396 A | 3/2008 |
| CN | 102270615 A | 12/2011 |
| DE | 102007004005 A1 | 10/2007 |
| JP | H10-056131 A | 2/1998 |
| JP | 2007-184525 A | 7/2007 |
| JP | 2007-251076 A | 9/2007 |
| JP | 2007-311518 A | 11/2007 |
| JP | 2008-41752 A | 2/2008 |
| JP | 2009-212302 A | 9/2009 |
| JP | 2009-224560 A | 10/2009 |
| JP | 2010-239033 A | 10/2010 |
| JP | 2011-216564 A | 10/2011 |

OTHER PUBLICATIONS

"High Conductivity Coppers for Electrical Engineering"; CDA publication 122; Copper Development Association; pp. 1-80; May 1998.
An Office Action, "Notification of Reason for Refusal," issued by the Japanese Patent Office on Sep. 9, 2014, which corresponds to Japanese Patent Application No. 2012-008083 and is related to U.S. Appl. No. 13/617,048; with English language partial translation.
The First Office Action issued by the State Intellectual Property Office of People's Republic of China on Feb. 27, 2015, which corresponds to Chinese Patent Application No. 201210385725.8 and is related to U.S. Appl. No. 13/617,048; with English language translation.

* cited by examiner

F I G . 9
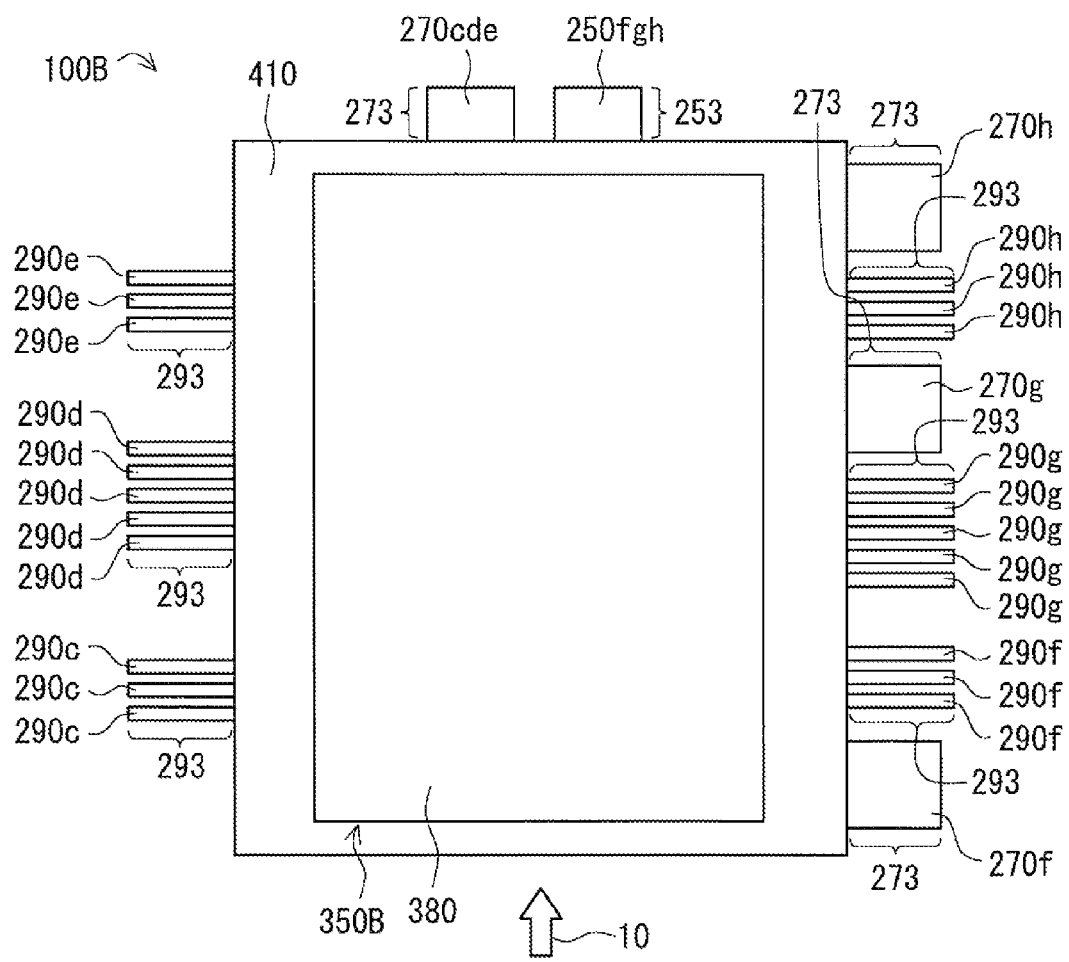

F I G. 1 4
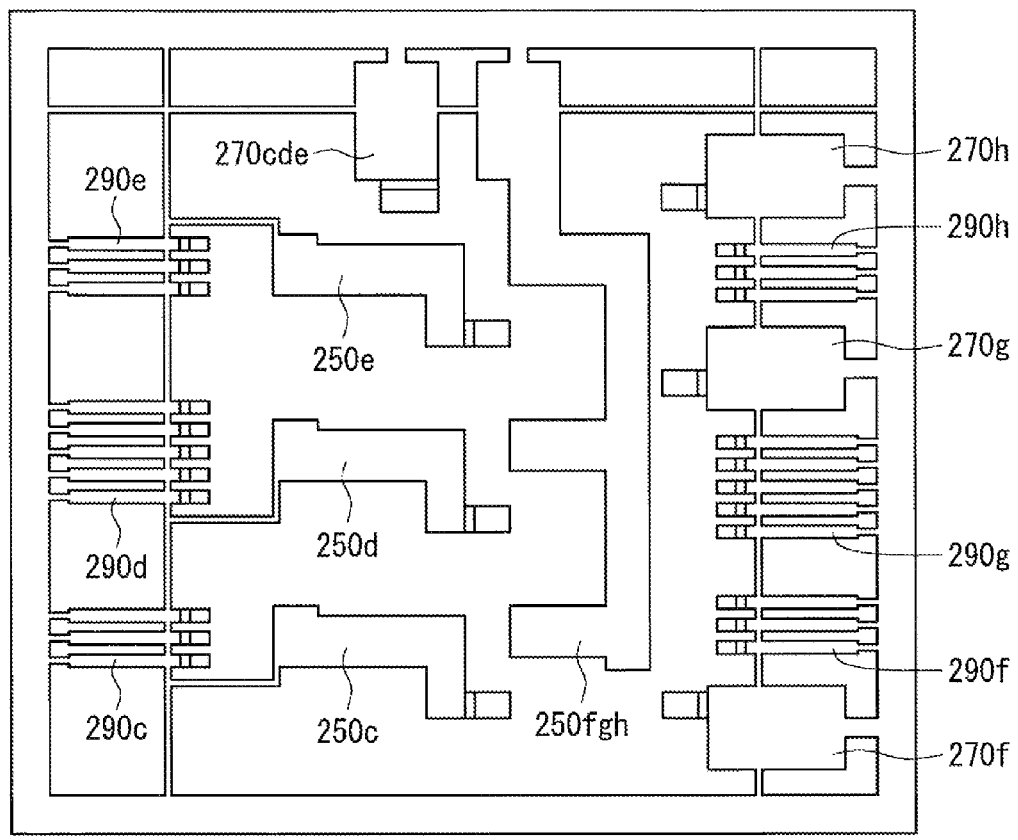

F I G. 2 4
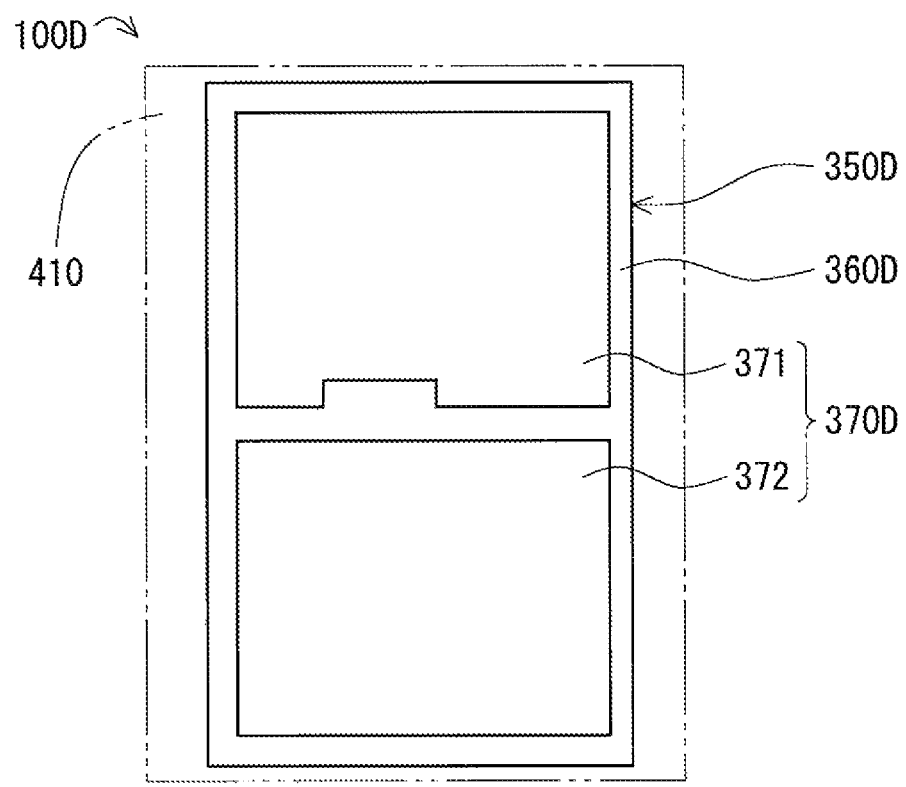

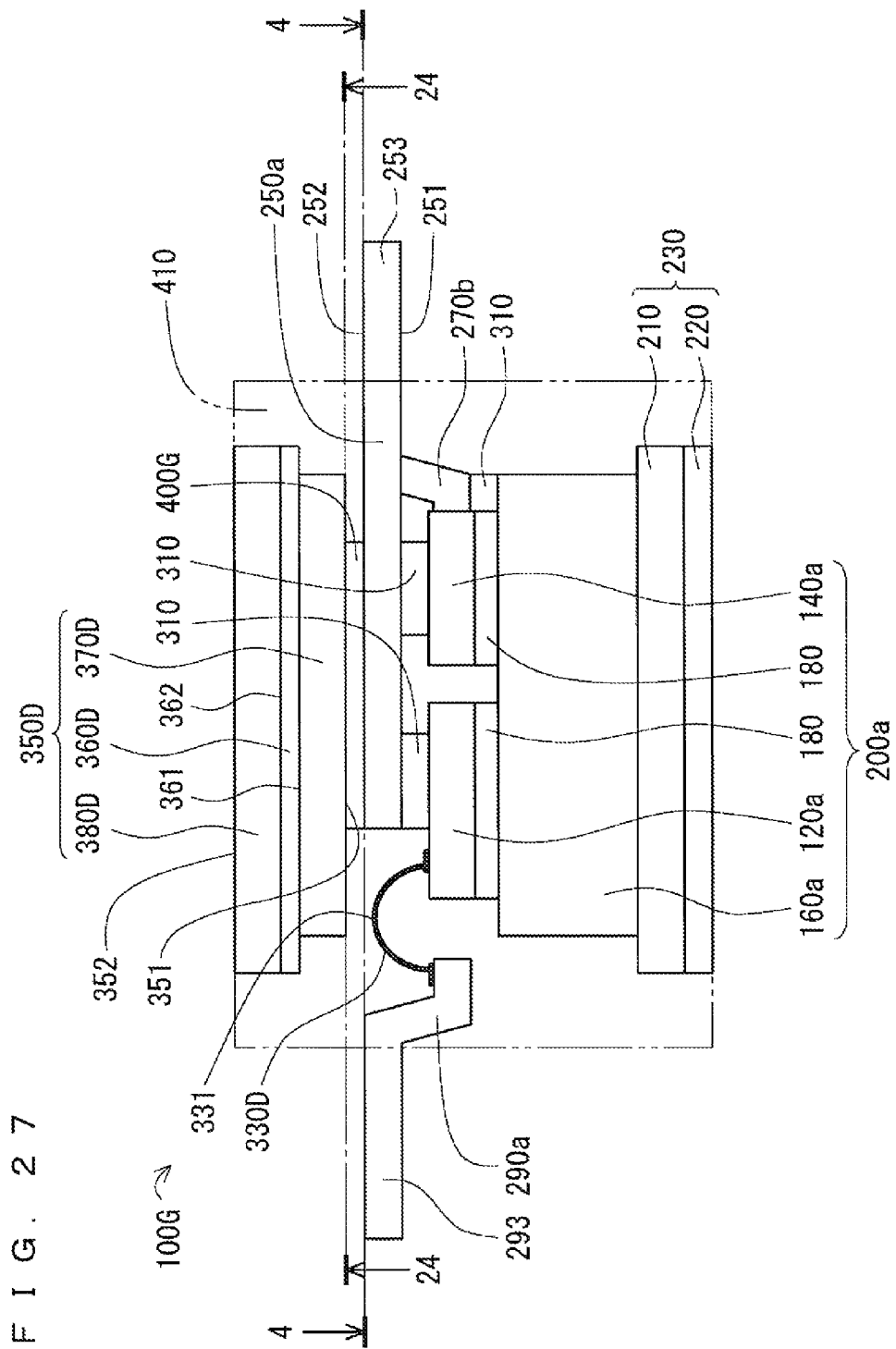

POWER SEMICONDUCTOR MODULE AND METHOD OF MANUFACTURING THE SAME

BACKGROUND OF THE INVENTION

1. Field of the Invention

The present invention relates to a power semiconductor module of resin-sealed type and a method of manufacturing the same.

2. Description of the Background Art

Recently, advances have been made which allow power semiconductor modules to, for example, have a larger capacity, a more compact size and a higher frequency. The heat generation density of a semiconductor element becomes higher along with this, which requires high cooling performance.

In a conventional cooling structure, a cooler is mounted onto one outer surface of a power semiconductor module, and the heat generated by the semiconductor element inside the module is transferred to the cooler and is dissipated. In this case, it is possible to improve cooling performance by reducing a thermal resistance of a member constituting a heat transfer path ranging from the semiconductor element to the cooler. In view of an increase in capacity of a module as descried above, however, such a measure against thermal resistance is limited.

As a solution to such a problem, there is the technology of Japanese Patent Application Laid-Open No. 2009-212302 (hereinafter, referred to as Patent Document 1). According to a semiconductor module of Patent Document 1, heat dissipating plates are respectively placed in thermal contact with both main surfaces of a semiconductor element, and each of the heat dissipating plates is electrically connected to an electrode of the semiconductor element. The heat dissipating plate is molded integrally with the semiconductor element with a molding resin.

In the semiconductor module of Patent Document 1, one heat dissipating plate is bonded to one surface of the semiconductor element, and the other heat dissipating plate is bonded to the other surface of the semiconductor element via a spacer. Solder is used for bonding of components.

This configuration requires a plurality of spacers and a plurality of heat dissipating plates in a case of a semiconductor module containing a plurality of semiconductor elements, resulting in a cost increase. Further, an increase in part count complicates manufacturing, also leading to a cost increase.

That is to say, the configuration of Patent Document 1 is unsuitable for a semiconductor module containing a plurality of semiconductor elements.

SUMMARY OF THE INVENTION

An object of the present invention is to provide the technology for reducing a cost of a power semiconductor module having high cooling performance.

An aspect of the present invention relates to a power semiconductor module of resin-sealed type, which includes at least one unit structure, an insulating member, a plurality of electrodes, an insulating substrate, and a molding resin. The at least one unit structure includes a plurality of semiconductor chips each having a first chip main surface and a second chip main surface, and a heat spreader having conductivity, to which the first chip main surfaces of the plurality of semiconductor chips are bonded with a first bonding member. The insulating member is located on a side opposite to the plurality of semiconductor chips when viewed from the heat spreader. The plurality of electrodes include at least one first electrode bonded to the second chip main surfaces of predetermined chips among the plurality of semiconductor chips with a second bonding member. The plurality of electrodes are provided by a lead frame in which the plurality of electrodes are formed in advance. The insulating substrate includes an insulating layer located on a side opposite to the plurality of semiconductor chips when viewed from the at least one first electrode, and a first conductive layer located between the insulating layer and the at least one first electrode and bonded to the at least one first electrode with a third bonding member. The molding resin seals the at least one unit structure and the plurality of electrodes in a state in which a surface of the insulating member on a side far from the plurality of semiconductor chips, a surface of the insulating substrate on the side far from the plurality of semiconductor chips, and external terminal portions of the plurality of electrodes are exposed.

According to the aspect above, high cooling performance is obtained through heat dissipation from the insulating member on the first chip main surface side and heat dissipation from the insulating substrate on the second chip main surface side. In addition, the insulating member and the insulating substrate are contained, whereby it is possible to use a cooler made of metal without providing another insulating member.

Further, the use of the lead frame enables to bond predetermined electrodes including the first electrodes at the same time. That is, an electrical interconnection can be formed more easily compared with the manufacturing method in which the separated electrodes are sequentially bonded. Moreover, with the lead frame, the internal connection portion (portion connected to the semiconductor chip or the like) and the external terminal portion are integrated. Accordingly, it is not required to separately provide an external terminal. Therefore, the number of manufacturing steps, component number, and the like can be reduced, leading to a reduction of manufacturing cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a plan view (top view) of a power semiconductor module according to a second preferred embodiment;

FIG. 14 is a plan view of a lead frame according to the second preferred embodiment;

FIG. 24 is a plan view of the power semiconductor module when viewed from a direction of an arrow at a position indicated by a line 24-24 in FIG. 22;

FIG. 27 is a side view of a power semiconductor module according to a seventh preferred embodiment.

DESCRIPTION OF THE PREFERRED EMBODIMENTS

<First Preferred Embodiment>

Figure 1:
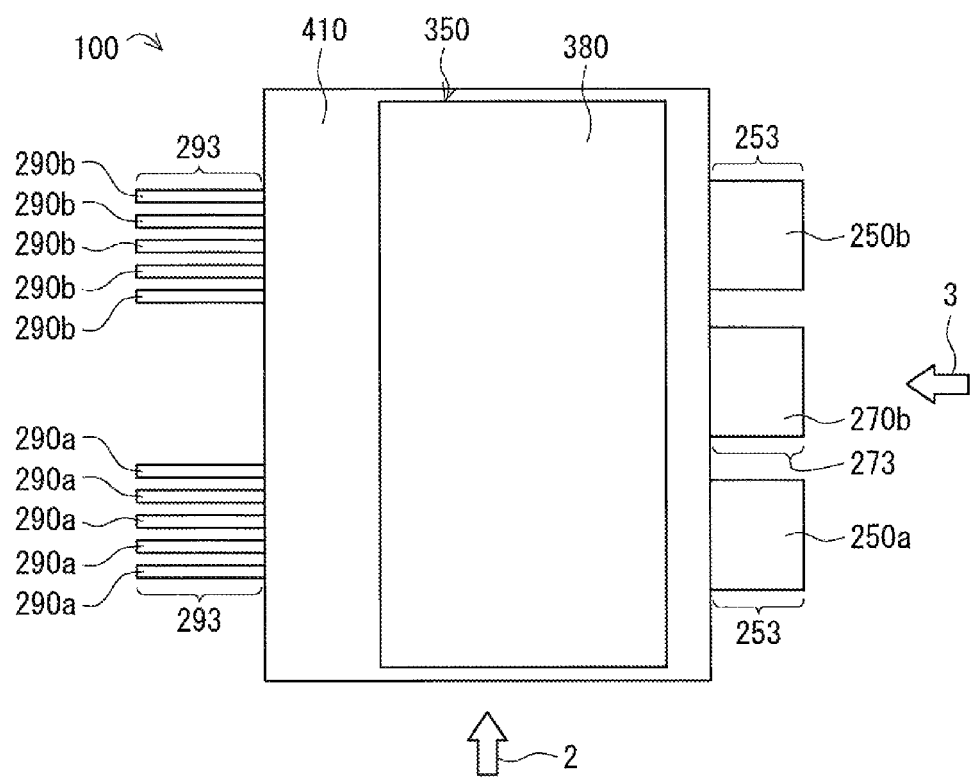
FIG. 1 is a plan view (top view) of a power semiconductor module according to a first preferred embodiment.
Figure 2:
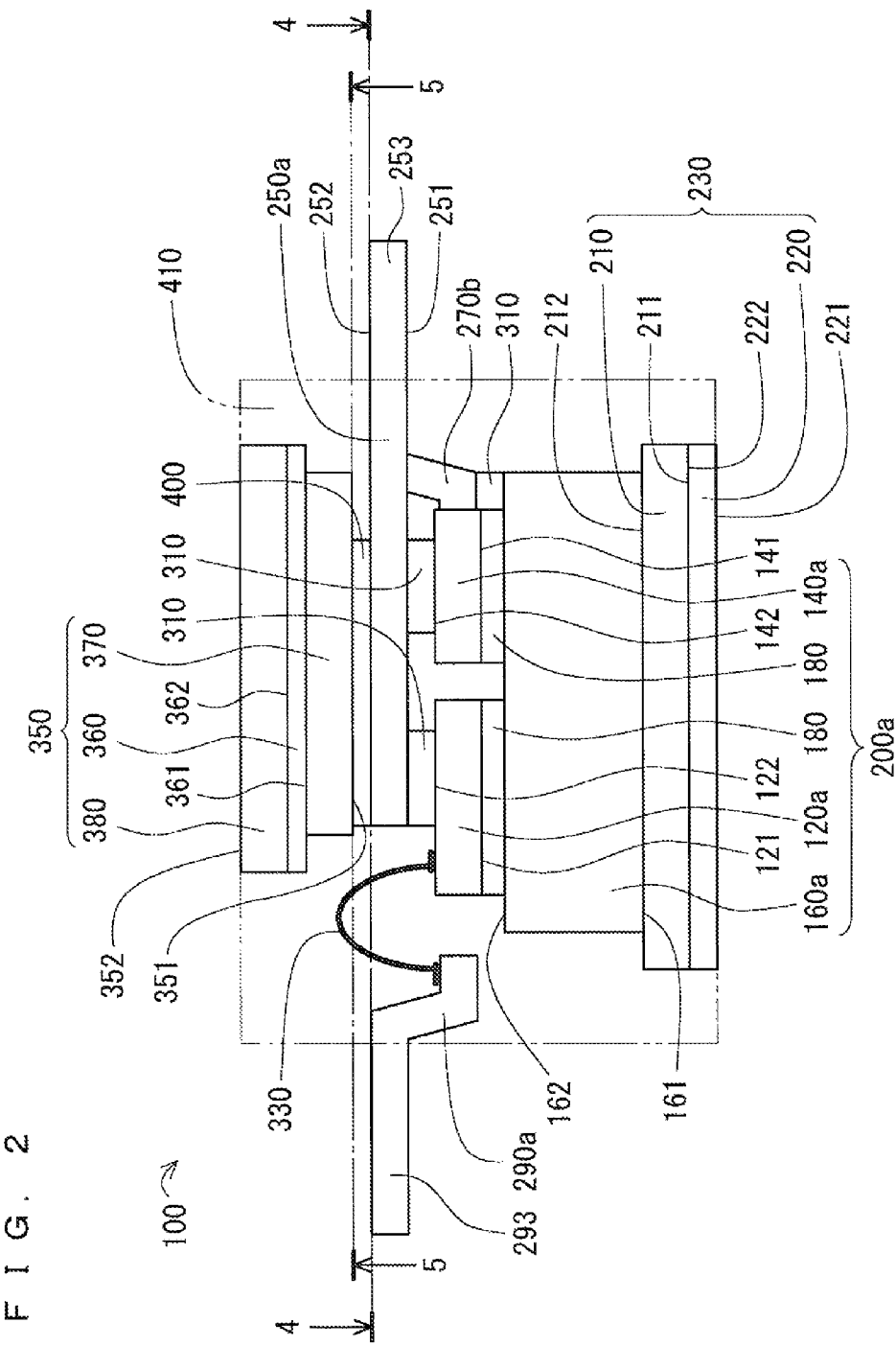
FIG. 2 is a side view of the power semiconductor module when viewed from a direction of an arrow 2 in FIG. 1.
Figure 3:
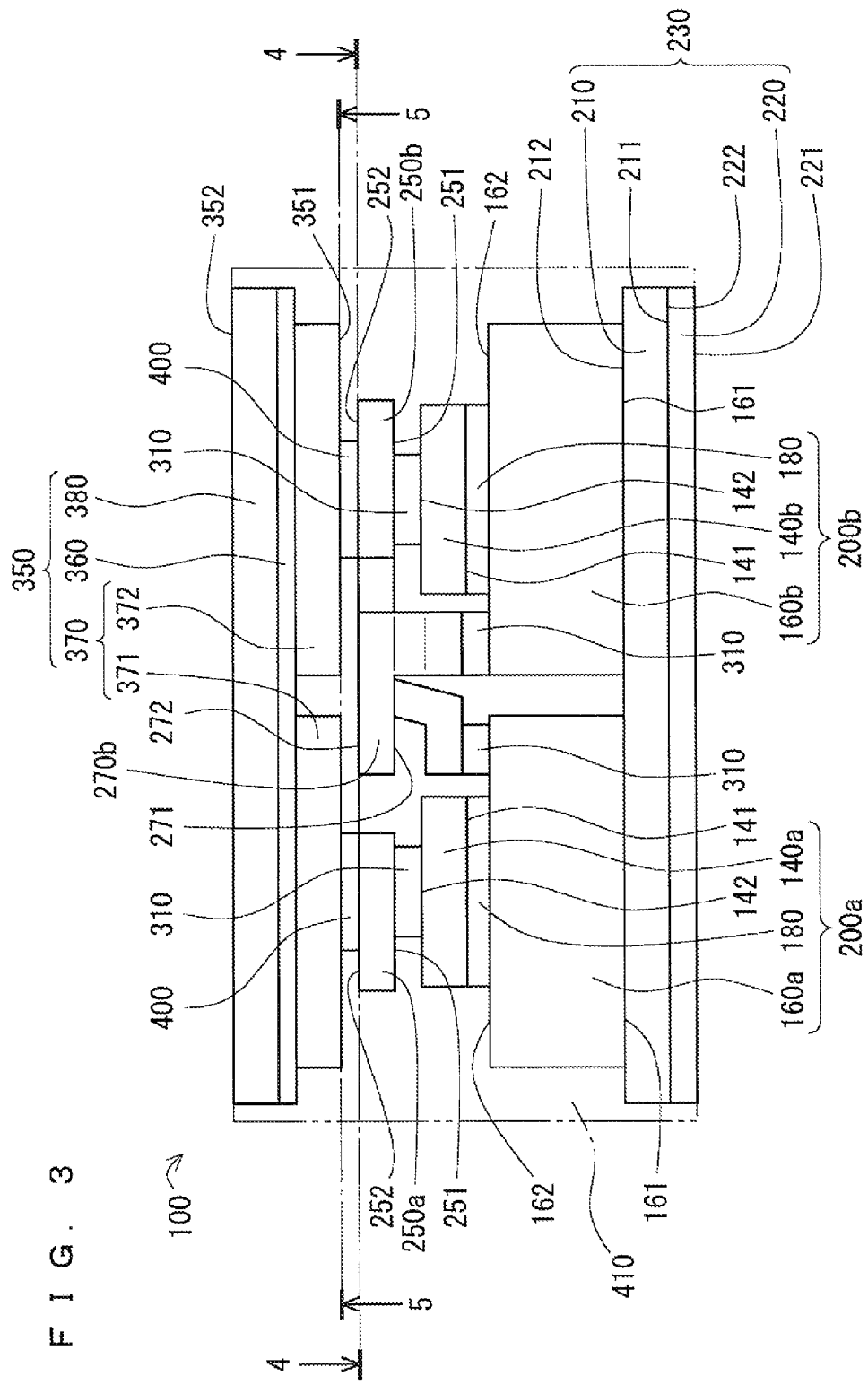
FIG. 3 is a side view of the power semiconductor module when viewed from a direction of an arrow 3 in FIG. 1.
Figure 4:
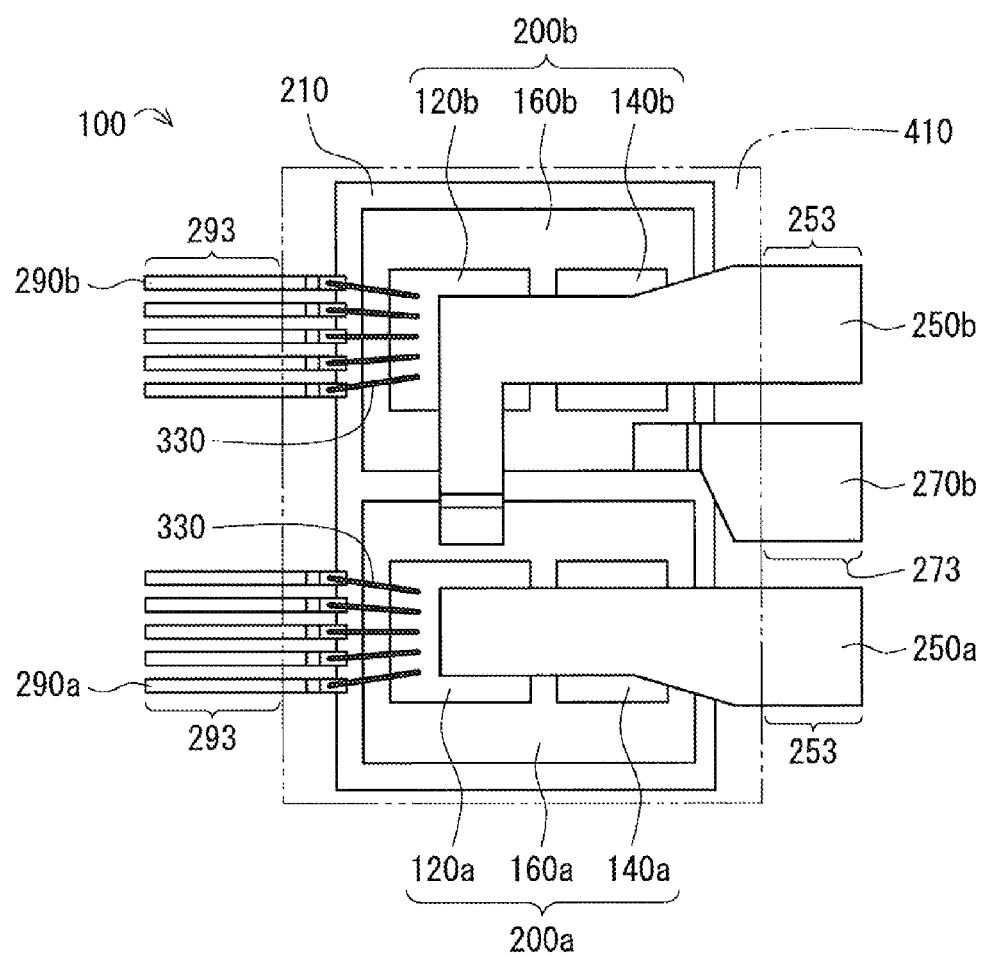
FIG. 4 is a plan view of the power semiconductor module when viewed from a direction of an arrow at a position indicated by a line 4-4 in FIGS. 2 and 3.
Figure 5:
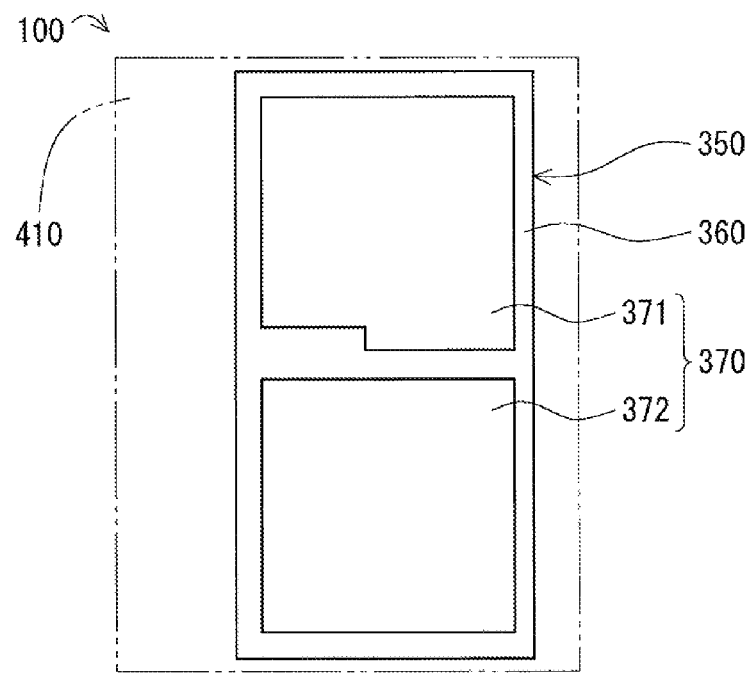
FIG. 5 is a plan view of the power semiconductor module when viewed from a direction of a an arrow at a position indicated by a line 5-5 in FIGS. 2 and 3.
Figure 6:
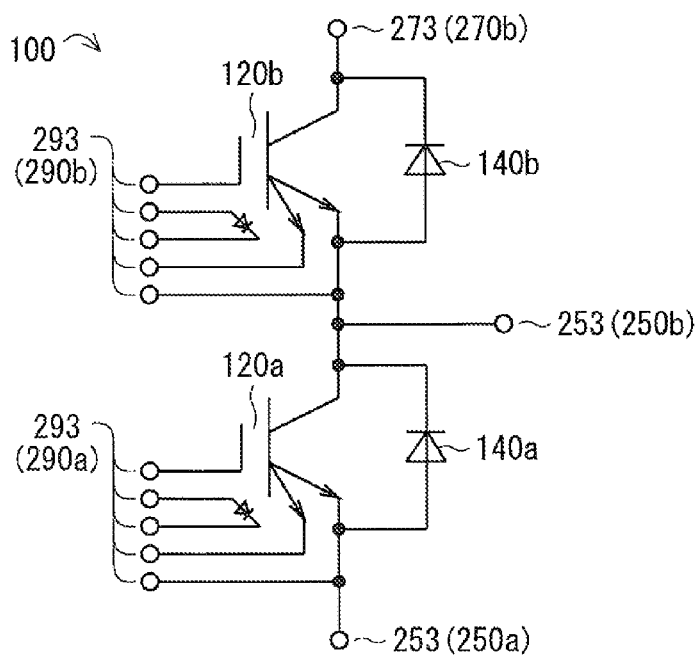
FIG. 6 is a circuit diagram of the power semiconductor module according to the first preferred embodiment.

FIGS. 1 to 5 show the configuration of a power semiconductor module 100 according to a first preferred embodiment. Specifically, FIG. 1 is a plan view (top view) of the power semiconductor module 100. FIG. 2 is a side view of the power semiconductor module 100 when viewed from a direction of an arrow 2 in FIG. 1, and FIG. 3 is a side view of the power semiconductor module 100 when viewed from a direction of an arrow 3 in FIG. 1. FIG. 4 is a plan view of the power semiconductor module 100 when viewed from an arrow at a position indicated by a line 4-4 in FIGS. 2 and 3. FIG. 5 is a plan view of the power semiconductor module 100 when viewed from an arrow at a position indicated by a line 5-5 in FIGS. 2 and 3. Note that FIGS. 2 to 5 show the state in which a molding resin described below (see reference numeral 410; an external shape thereof is indicated by a chain double-dashed line for reference) is removed for the sake of description. FIG. 6 is a circuit diagram of the power semiconductor module 100.

According to the example of FIGS. 1 to 5, the power semiconductor module 100 includes power semiconductor chips 120a, 120b, 140a, and 140b, heat spreaders 160a and 160b, a first bonding member 180, an insulating sheet 210, a foil-like sheet 220, first electrodes 250a and 250b, a second electrode 270b, third electrodes 290a and 290b, a second bonding member 310, wires 330, an insulating substrate 350, a third bonding member 400, and a molding resin 410.

The semiconductor chips 120a and 120b are insulated gate bipolar transistor (IGBT) chips herein. The IGBT chip 120a has a first chip main surface 121 and a second chip main surface 122 which are in the relation of front and back surfaces (in other words, which are opposed to each other via the chip inside). Although detailed description is not given, here, a collector electrode of the IGBT is formed on the first chip main surface 121, and an emitter electrode and a gate electrode of the IGBT are formed on the second chip main surface 122. The IGBT chip 120b is configured similarly to the IGBT chip 120a.

In accordance with this example, the first chip main surface 121 and the second chip main surface 122 in the IGBT chips 120a and 120b are also referred to as collector surface 121 and emitter/gate surface 122, respectively. Alternatively, the first chip main surface 121 and the second chip main surface 122 are also referred to as lower surface 121 and upper surface 122, respectively, according to the illustration of FIG. 2. Also, the IGBT chips 120a and 120b are merely referred to as IGBTs 120a and 120b, respectively, in some cases.

The semiconductor chips 140a and 140b are diode chips herein. The diode chip 140a has a first chip main surface 141 and a second chip main surface 142 which are in the relation of front and back surfaces. Although detailed description is not given, here, a cathode electrode is formed on the first chip main surface 141, and an anode electrode is formed on the second chip main surface 142. The diode chip 140b is configured similarly to the diode chip 140a.

In accordance with this example, the first chip main surface 141 and the second chip main surface 142 in the diode chips 140a and 140b are also referred to as cathode surface 141 and anode surface 142, respectively. Alternatively, the first chip main surface 141 and the second chip main surface 142 are also referred to as lower surface 141 and upper surface 142, respectively, according to the illustration of FIG. 2. Also, the diode chips 140a and 140b are merely referred to as diodes 140a and 140b, respectively, in some cases.

The IGBT chips 120a and 120b and the diode chips 140a and 140b are also referred to as power semiconductor chips 120a, 120b, 140a, and 140b, respectively, in some cases.

The heat spreaders 160a and 160b are so-called heat dissipation members. The heat spreaders 160a and 160b are made of, for example, copper, and because of such a material, the heat spreaders 160a and 160b are conductive.

While the case where the heat spreaders 160a and 160b are the same rectangular solids is described here as an example, the shapes and sizes of the heat spreaders 160a and 160b are not limited to this example.

The heat spreader 160a being a rectangular solid has surfaces 161 and 162 which are in the relation of front and back surfaces. The surface 161 and the surface 162 are also referred to as lower surface 161 and upper surface 162, respectively, according to the illustration of FIG. 2. The heat spreader 160a is a rectangular solid, and thus, the two surfaces 161 and 162 are flat and parallel to each other.

The upper surface 162 of the heat spreader 160a is used as a chip-mounting surface, and the IGBT chip 120a and the diode chip 140a are disposed side by side on the chip-mounting surface 162. More specifically, the lower surface 121 of the IGBT chip 120a and the lower surface 141 of the diode chip 140a are bonded to the chip-mounting surface 162 of the heat spreader 160a with the first bonding member 180. The first bonding member 180 is, for example, solder.

Similarly, the heat spreader 160b has the lower surface 161 and the upper surface 162, and the upper surface 162 is used as a chip-mounting surface. That is, the lower surface 121 of the IGBT chip 120b and the lower surface 141 of the diode chip 140b are bonded to the chip-mounting surface 162 of the heat spreader 160b with the first bonding member 180.

As shown in FIGS. 2 and 3, the chip-mounting surfaces 162 of the heat spreaders 160a and 160b are all in the same plane, and the heat spreaders 160a and 160b are located on the same side with respect to the same plane. In addition, the heat spreaders 160a and 160b are far from each other.

Here, the structure in which the semiconductor chips 120a and 140a are bonded to the heat spreader 160a is referred to as a unit structure 200a. Similarly, the structure in which the semiconductor chips 120b and 140b are bonded to the heat spreader 160b is referred to as a unit structure 200b.

The insulating sheet 210 is a sheet-like insulating member, and is formed of, for example, an epoxy resin filled with a filler. The insulating sheet 210 is located on the side opposite to the semiconductor chips 120a, 120b, 140a, and 140b when viewed from the heat spreaders 160a and 160b, and the heat spreaders 160a and 160b are disposed on the insulating sheet 210. More specifically, the insulating sheet 210 has sheet surfaces 211 and 212 which are in the relation of front and back surfaces, and the lower surfaces 161 of the heat spreaders 160a and 160b adhere to the sheet surface 212. The sheet surface 211 and the sheet surface 212 are also referred to as lower surface 211 and upper surface 212, respectively, according to the illustration of FIG. 2.

The foil-like sheet 220 is a foil-like conductive member, and is made of, for example, copper, aluminum, or the same. The foil-like sheet 220 is located on the side opposite to the heat spreaders 160a and 160b when viewed from the insulating sheet 210, and faces the insulating sheet 210. More specifically, the foil-like sheet 220 has sheet surfaces 221 and 222 which are in the relation of front and back surfaces, and the lower surface 211 of the insulating sheet 210 adheres to the sheet surface 222. The sheet surface 221 and the sheet surface 222 are also referred to as lower surface 221 and upper surface 222, respectively, according to the illustration of FIG. 2.

Here, the laminate of the insulating sheet 210 and the foil-like sheet 220 may be referred to as, for example, a foil-attached insulating sheet 230 or foil-attached insulating member 230. In this case, the upper surface 212 of the insulating sheet 210 corresponds to the upper surface of the foil-attached insulating sheet 230, and the lower surface 221 of the foil-like sheet 220 corresponds to the lower surface of the foil-attached insulating sheet 230.

The first electrodes 250a and 250b and the second electrode 270b are electrodes through which the main current of the power semiconductor module 100 flows, that is, main electrodes. In view of the above, the first electrodes 250a and 250b are also referred to as first main electrodes 250a and 250b, and the second electrode 270b is also referred to as second main electrode 270b. The main electrode may also be referred to as main interconnection.

Basically, the main electrodes 250a, 250b, and 270b are plate-like members having a predetermined plane pattern (see FIG. 4), and are formed of, for example, copper. Accordingly, the first main electrodes 250a and 250b have electrode main surfaces 251 and 252 which are in the relation of front and back surfaces, and similarly, the second main electrode 270b also has electrode main surfaces 271 and 272. According to the illustration of FIG. 2, the electrode main surfaces 251 and 271 are also referred to as lower surfaces 251 and 271, respectively, and the electrode main surfaces 252 and 272 are also referred to as upper surfaces 252 and 272, respectively.

The first main electrode 250a is an electrode bonded to the upper surfaces (that is, second chip main surfaces) 122 and 142 of the semiconductor chips 120a and 140a included in the unit structure 200a. Specifically, the lower surface 251 of the first main electrode 250a is bonded to the emitter electrode of the IGBT chip 120a and the anode electrode of the diode chip 140a with the second bonding member 310. The second bonding member 310 is, for example, solder.

The first main electrode 250b is an electrode bonded to the upper surfaces (that is, second chip main surfaces) 122 and 142 of the semiconductor chips 120b and 140b included in the unit structure 200b. Specifically, the lower surface 251 of the first main electrode 250b is bonded to the emitter electrode of the IGBT chip 120b and the anode electrode of the diode chip 140b with the second bonding member 310.

The first main electrode 250b extends into the adjacent heat spreader 160a, and the lower surface 251 of the first main electrode 250b is bonded to the chip-mounting surface 162 of the adjacent heat spreader 160a with the second bonding member 310.

The second main electrode 270b is an electrode bonded to the heat spreader 160b included in the unit structure 200b. Specifically, the lower surface 271 of the second main electrode 270b is bonded to the chip-mounting surface 162 of the heat spreader 160b with the second bonding member 310.

The first main electrodes 250a and 250b each have an external terminal portion 253 projecting out of the molding resin 410 (accordingly, which is not covered with the molding resin 410), and similarly, the second main electrode 270b has an external terminal portion 273. Also, the external terminal portions 253 and 273 are merely referred to as external terminals 253 and 273, respectively.

The third electrodes 290a and 290b are electrodes used for, for example, controlling, monitoring, and managing the power semiconductor module 100. In contrast to the first electrodes 250a and 250b and the second electrode 270b that are main electrodes, the third electrodes 290a and 290b are referred to as auxiliary electrodes 290a and 290b as well. The auxiliary electrode may be referred to as an auxiliary interconnection.

The auxiliary electrode 290a is provided to the unit structure 200a, and FIG. 4 illustrates a plurality of auxiliary electrodes 290a. Each of the auxiliary electrodes 290a is connected to a predetermined portion (such as a gate electrode pad, emitter electrode pad, current sensing pad for current detection, or temperature sensing pad for temperature detection) of the IGBT chip 120a with the wire 330 made of aluminum or the like in accordance with its use.

The wire 330 has a wire-loop shape in which it projects toward the insulating substrate 350 side when viewed from the heat spreader 160a.

The auxiliary electrodes 290b are provided to the unit structure 200b, and are connected to predetermined portions with the wires 330 similarly to the auxiliary electrodes 290a described above.

Note that the number and use of the auxiliary electrodes 290a and 290b are not limited to this example.

The auxiliary electrodes 290a and 290b are formed of, for example, copper. The auxiliary electrodes 290a and 290b are not the electrodes through which the main current of the power semiconductor module 100 flows, and thus, are narrower than the main electrodes 250a, 250b, and 270b (see FIG. 4).

The auxiliary electrodes 290a and 290b each have an external terminal portion 293 projecting out of the molding resin 410 (accordingly, which is not covered with the molding resin 410). The external terminal portion 293 is merely referred to as an external terminal 293 as well.

Figure 7:
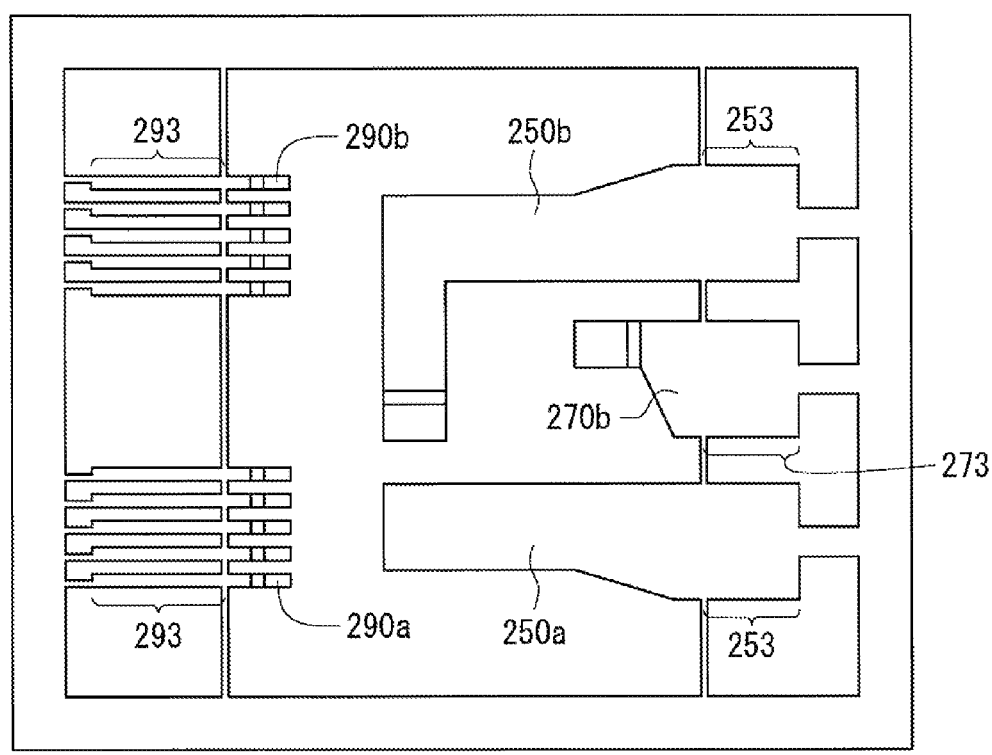
FIG. 7 is a plan view of a lead frame according to the first preferred embodiment.

The electrodes 250a, 250b, 270b, 290a, and 290b described above are provided by a lead frame in which the patterns of the electrodes 250a, 250b, 270b, 290a, and 290b are integrally formed in advance. FIG. 7 illustrates a plan view of a lead frame 500 as described above. A method of manufacturing the power semiconductor module 100 using the lead frame 500 is described below.

Referring back to FIGS. 1 to 5, the insulating substrate 350 is a plate-like member including an insulating layer 360, a first conductive layer 370, and a second conductive layer 380.

The insulating layer 360 is formed of, for example, an epoxy resin filled with a filler or ceramics, and has main surfaces 361 and 362 which are in the relation of front and back surfaces. The main surface 361 and the main surface 362 are also referred to as lower surface 361 and upper surface 362, respectively, according to the illustration of FIG. 2.

The first conductive layer 370 is provided on the lower surface 361 of the insulating layer 360, and the second insulating layer 380 is provided on the upper surface 362 of the insulating layer 360. The conductive layers 370 and 380 are formed of, for example, copper.

As illustrated in FIG. 5, the first conductive layer 370 has two portions 371 and 372 far from each other at predetermined portions on the lower surface 361. That is, the first conductive layer 370 is divided into two in the plane pattern. Meanwhile, as illustrated in FIG. 1, the second conductive layer 380 is not divided but extends over the entire upper surface 362 of the insulating layer 360.

Here, in the laminate of the insulating layer 360, and the conductive layers 370 and 380, the substrate main surfaces 351 and 352 of the insulating substrate 350 are considered as follows. The substrate main surface 351 (also referred to as lower surface 351 according to the illustration of FIG. 2) is composed of a portion of the lower surface 361 of the insulating layer 360, which is not in contact with the first conductive layer 370, and a surface of the first conductive layer 370, which is not in contact with the insulating layer 360. The substrate main surface 352 (also referred to as upper surface 352 according to the illustration of FIG. 2) is composed of a surface of the second conductive layer 380, which is located on the side opposite to the insulating layer 360.

In a case where the second conductive layer 380 does not cover the entire upper surface 362 of the insulating layer 360 differently from the above-mentioned example, the substrate main surface 352 is composed of a portion of the upper surface 362 of the insulating layer 360, which is not in contact with the second conductive layer 380, and a surface of the second conductive layer 380, which is not in contact with the insulating layer 360.

The insulating substrate 350 is located on the side opposite to the semiconductor chips 120a, 140a, 120b, and 140b when viewed from the electrodes 250a, 250b, 270b, 290a, and 290b, and the first conductive layer 370 is directed toward the electrodes 250a, 250b, 270b, 290a, and 290b. The divided portion 371 of the first conductive layer 370 is bonded to the upper surface 252 of the first main electrode 250a with the third bonding member 400, whereas the divided portion 372 of the first conductive layer 370 is bonded to the upper surface 252 of the first main electrode 250b with the third bonding member 400. The third bonding member 400 is, for example, solder.

The molding resin 410 is, for example, an epoxy resin. The molding resin 410 seals the unit structures 200a and 200b and the wires 330 in the state in which the external terminal portions 253, 273, and 293 of the electrodes 250a, 250b, 270b, 290a, and 290b, the lower surface 221 of the foil-attached insulating member 230 (that is, the surface of the insulating member 230 on a side far from the semiconductor chips 120a, 140a, 120b, and 140b), and the upper surface 352 of the insulating substrate 350 (that is, the surface of the insulating substrate 350 on a side far from the semiconductor chips 120a, 140a, 120b, and 140b) are exposed. That is, the unit structures 200a and 200b, the portions of the electrodes 250a, 250b, 270b, 290a, and 290b except for the external terminal portions 253, 273, and 293, and the wires 330 are buried in the molding resin 410.

In the example of FIGS. 2 and 3, the exposed surface 221 of the foil-attached insulating member 230 and the exposed surface 352 of the insulating substrate 350 are continuous from the outer surface of the molding resin 410 without any difference in level.

A cooler (not shown; in other words, heat sink) is mounted onto each of the exposed surface 221 of the foil-attached insulating member 230 and the exposed surface 352 of the insulating substrate 350 via a thermally conductive grease or the like.

With the structure as described above, the collector electrode of the IGBT 120a and the cathode electrode of the diode 140a are connected by the heat spreader 160a, and the emitter electrode of the IGBT 120a and the anode electrode of the diode 140a are connected by the first main electrode 250a. That is, as shown in the circuit diagram of FIG. 6, the IGBT 120a and the diode 140a are brought into anti-parallel connection (in other words, reverse-parallel connection). Similarly, the IGBT 120b and the diode 140b are brought into anti-parallel connection by the heat spreader 160b and the first main electrode 250b.

The first main electrode 250b is connected to the adjacent heat spreader 160a. As a result, the emitter electrode of the IGBT 120b and the anode electrode of the diode 140b are connected to the collector electrode of the IGBT 120a and the cathode electrode of the diode 140a. That is, as shown in FIG. 6, the anti-parallel circuit composed of the IGBT 120b and the diode 140b is connected in series with the anti-parallel circuit composed of the IGBT 120a and the diode 140a.

The first main electrodes 250a and 250b each have the external terminal 253 outside the molding resin 410, and the second electrode 270b connected to the heat spreader 160b has the external terminal 273 outside the molding resin 410. Supplied between the external terminal 273 of the second main electrode 270b and the external terminal 253 of the first main electrode 250b is a main voltage applied to the IGBTs 120a and 120b and the diodes 140a and 140b.

Applied to the gate electrode of the IGBT 120a from the external terminal 293 of the auxiliary electrode 290a is a switch control voltage for causing the IGBT 120a to perform a switch operation. More specifically, the switch control voltage is applied between the external terminal 293 connected to the gate electrode of the IGBT 120a and the external terminal 293 connected to the emitter electrode of the IGBT 120a. Similarly, the switch control voltage is applied to the IGBT 120b.

A current flows through the semiconductor chips 120a, 120b, 140a, and 140b, whereby the semiconductor chips 120a, 120b, 140a, and 140b generate heat. The generated heat is transferred from the lower surfaces 121 and 141 of the semiconductor chips 120a, 120b, 140a, and 140b to the cooler (not shown) on the foil-like sheet 220 side through the bonding member 180, the heat spreaders 160a and 160b, the insulating sheet 210, and the foil-like sheet 220. In addition, the generated heat is transferred from the upper surfaces 122 and 142 of the semiconductor chips 120a, 120b, 140a, and 140*b* to the cooler (not shown) on the insulating substrate 350 side through the bonding member 310, the first main electrodes 250*a* and 250*b*, the bonding member 400, and the insulating substrate 350. Accordingly, heat is dissipated by the two coolers, so that the semiconductor chips 120*a*, 120*b*, 140*a*, and 140*b* are cooled.

In particular, a material having higher thermal conductivity than the molding resin 410 is adopted for the materials constituting the heat transfer paths ranging from the semiconductor chips 120*a*, 120*b*, 140*a*, and 140*b* to the coolers.

As described above, the power semiconductor module 100 dissipates heat from both of the lower surfaces 121 and 141 side and the upper surfaces 122 and 142 side of the semiconductor chips 120*a*, 120*b*, 140*a*, and 140*b*. For this reason, higher cooling performance can be achieved compared with the conventional configuration in which cooling is performed from only one side.

Even in a case where the cooler is made of a metal such as aluminum or copper, the power semiconductor module 100 and the cooler can be brought into contact without providing another insulating member therebetween. This is because the power semiconductor module 100 contains the insulating sheet 210 and the insulating substrate 350.

Specifically, the heat spreaders 160*a* and 160*b* constitute part of the main current path but are not exposed to the outside owing to the presence of the insulating sheet 210 and the molding resin 410. Therefore, insulating properties are ensured between the heat spreaders 160*a* and 160*b* and the cooler.

The main electrodes 250*a*, 250*b*, and 270*b* are not exposed to the outside owing to the presence of the insulating substrate 350 and the molding resin 410, except for the external terminals 253 and 273. The external terminals 253 and 273 are drawn from the surface different from the surface on which the cooler is mounted. Therefore, insulating properties are ensured between the main electrodes 250*a*, 250*b*, and 270*b*, and the cooler.

The cooling performance is improved and insulating properties are ensured if one or both of the foil-like sheet 220 and the second conductive layer 380 of the insulating substrate 350 are not provided. Also, some of the various effects described below can be achieved if one or both of the foil-like sheet 220 and the second conductive layer 380 of the insulating substrate 350 are not provided.

Next, the method of manufacturing the power semiconductor module 100 is described.

The IGBT chip 120*a* and the diode chip 140*a* are bonded onto the heat spreader 160*a* with the first bonding member 180. Similarly, the IGBT chip 120*b* and the diode chip 140*b* are bonded onto the heat spreader 160*b* with the first bonding member 180.

Next, the semiconductor chips 120*a*, 120*b*, 140*a*, and 140*b*, and the like are bonded to the lead frame 500 (see FIG. 7) in which the patterns of the electrodes 250*a*, 250*b*, 270*b*, 290*a*, and 290*b* are integrally formed in advance.

Specifically, the first main electrode 250*a* in the lead frame 500 is bonded to the emitter electrode of the IGBT chip 120*a* and the anode electrode of the diode chip 140*a* with the second bonding member 310. The first main electrode 250*b* in the lead frame 500 is bonded to the emitter electrode of the IGBT chip 120*b*, the anode electrode of the diode chip 140*b*, and the upper surface 162 of the heat spreader 160*a* with the second bonding member 310. The second main electrode 270*b* in the lead frame 500 is bonded to the upper surface 162 of the heat spreader 160*b* with the second bonding member 310.

With the use of the lead frame 500, the above-mentioned portions can be bonded at the same time.

The third electrodes (auxiliary electrodes) 290*a* and 290*b* in the lead frame 500 are respectively connected to the predetermined portions (such as the gate electrode pads, emitter electrode pads, sensing pads for current detection, and sensing pads for temperature detection of the IGBT chips 120*a* and 120*b*) with the wires 330.

After that, the first main electrodes 250*a* and 250*b* in the lead frame 500 and the divided portions 371 and 372 of the first conductive layer 370 of the insulating substrate 350 are bonded to each other with the third bonding member 400.

Then, the formation (half-finished product) manufactured as described above is housed in a molding die and is sealed with a molding resin.

Specifically, the foil-attached insulating sheet 230 in which the foil-like sheet 220 and the insulating sheet 210 are laminated and adhere to each other in advance is disposed in the resin injection space of the molding die. Alternatively, the foil-like sheet 220 and the insulating sheet 210 are laminated in this order in the resin injection space. After that, the half-finished product is disposed on the insulating sheet 210 with the surface 161 (lower surface 161 in the illustration of FIG. 2), which is located on the side opposite to the chip mounting surface 162, being directed to the insulating sheet 210 in the molding die. Then, a sealing material for the molding resin 410 is poured into the resin injection space.

For example, the resin injection space of the molding die is designed for preventing the molding resin 410 from covering the external terminal portions 253, 273, and 293 of the electrodes 250*a*, 250*b*, 270*b*, 290*a*, and 290*b*, the sheet surface 221 of the foil-attached insulating member 230, which is located on the side far from the semiconductor chips 120*a*, 120*b*, 140*a*, and 140*b*, and the substrate main surface 352 of the insulating substrate 350, which is located on the side far from the semiconductor chips 120*a*, 120*b*, 140*a*, and 140*b*.

After sealing, the connection portions of the outer perimeter of the lead frame 500 and the electrodes 250*a*, 250*b*, 270*b*, 290*a*, and 290*b*, the connection portions between the main electrodes 250*a*, 250*b*, and 270*b*, and the connection portions between the auxiliary electrodes 290*a* and 290*b* are cut. As a result, the power semiconductor module 100 can be obtained.

With the use of the lead frame 500 as described above, the main electrodes 250*a*, 250*b*, and 270*b* can be bonded to the predetermined portions at the same time. That is, an electrical interconnection can be formed more easily compared with the manufacturing method in which separated electrodes are sequentially bonded. Further, according to the lead frame 500, the electrodes 250*a*, 250*b*, 270*b*, 290*a*, and 290*b* are provided as the members in which the internal connection portions (portions connected to the semiconductor chip, heat spreader, or wire) and the external terminal portions 253, 273, and 293 are integrated. For this reason, it is not required to separately provide the external terminals. This results in reductions of the number of manufacturing steps, part count, and the like, leading to a reduction of manufacturing cost.

The first conductive layer 370 of the insulating substrate 350 is divided, so that the divided portion 371 is bonded to the first main electrode 250*a*, whereas the other divided portion 372 is bonded to the first main electrode 250*b*. Accordingly, the insulating properties between the main electrodes 250*a* and 250*b* are ensured. That is, it is not required to separately provide a different insulating substrate to the main electrodes 250*a* and 250*b* having different potentials, and the single insulating substrate 250 is sufficient. This results in reductions of the part count, number of manufacturing steps, and the like, leading to a reduction of manufacturing cost.

According to the single insulating substrate 350, a flat surface can be provided easily to the cooler, which brings the insulating substrate 350 and the cooler into intimate contact with each other excellently.

According to the single insulating substrate 350, the surface of the divided portion 371, which is bonded to the lead frame 500, and the surface of the divided portion 372, which is bonded to the lead frame 500, are easily caused to be all in the same plane (see the line 5-5 in FIGS. 2 and 3). Meanwhile, according to the lead frame 500, the surface of the first main electrode 250a, which is bonded to the insulating substrate 350, and the surface of the first main electrode 250b, which is bonded to the insulating substrate 350, are easily caused to be all in the same plane (see the line 4-4 in FIGS. 2 and 3).

Therefore, the insulating substrate 350 and the first main electrodes 250a and 250b can be easily bonded to each other without a tilt of the insulating substrate 350.

The insulating substrate 350 is not tilted, which prevents the formation of a gap between the upper surface 352 of the insulating substrate 350 and the inner surface of the molding die. Accordingly, the molding resin is prevented from being placed on the upper surface 352 of the insulating substrate 350, so that the upper surface 352 is readily exposed.

The first conductive layer 370 of the insulating substrate 350 is divided, which increases a contact area of the lower surface 361 of the insulating layer 360 with the molding resin 410. Specifically, the region between the divided portions 371 and 372 in the lower surface 361 of the insulating layer 360 is more conducive to an increase of the contact area between the insulating layer 360 and the molding resin 410 compared with the case in which the divided portions 371 and 372 are continuous from each other. The insulating layer 360 made of resin is in more intimate contact with (in other words, has more excellent adhesion to) the molding resin 410 compared with the divided portions 371 and 372 made of metal. Accordingly, an increase of the contact area between the insulating layer 360 and the molding resin 410 can improve the insulation reliability of the insulating layer 360, the insulation reliability of the interface between the insulating layer 360 and the molding resin 410, and the like.

The first conductive layer 370 is divided, which enables to relax a thermal stress exerted on the insulating layer 360 by the first conductive layer 370.

Figure 8:
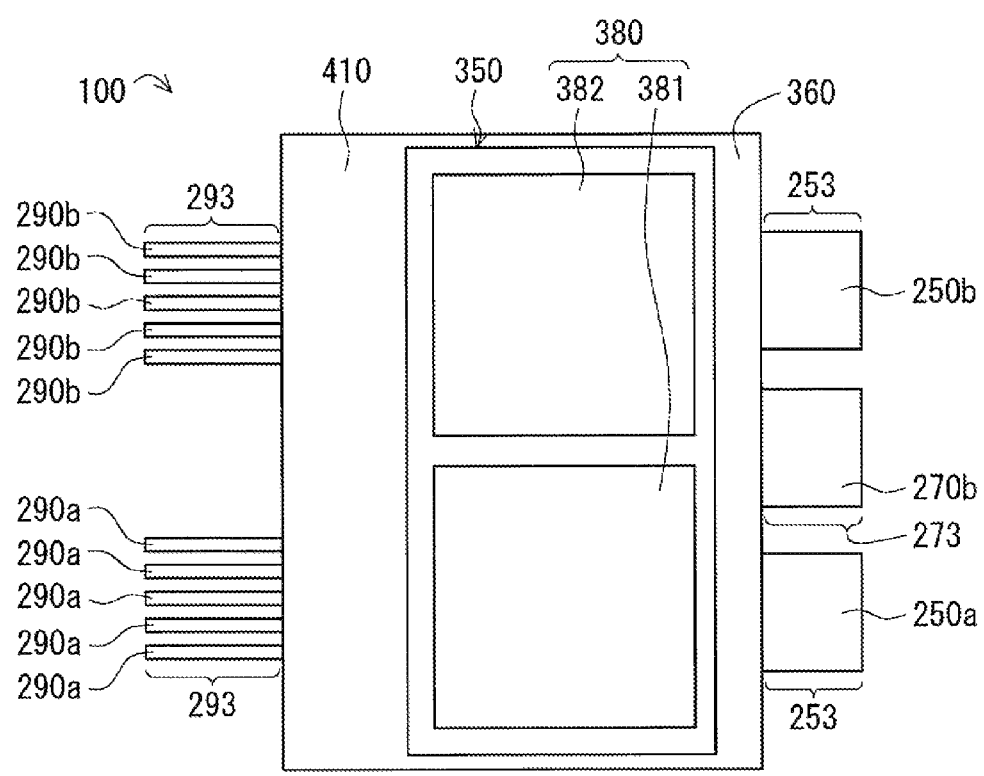
FIG. 8 is a plan view (top view) of another power semiconductor module according to the first preferred embodiment.

While the case in which the second conductive layer 380 of the insulating substrate 350 is not divided (see FIG. 1) has been illustrated, the second conductive layer 380 may be divided. FIG. 8 shows an example in which the second conductive layer 380 is divided into two portions 381 and 382. In the example of FIG. 8, schematically, the divided portion 381 is provided in the region in which the divided portion 371 of the first conductive layer 370 is projected on the upper surface 362 of the insulating layer 360, and the divided portion 382 is provided in the region in which the divided portion 372 of the first conductive layer 370 is projected on the upper surface 362 of the insulating layer 360. Note that the division number, division pattern (in other words, plane pattern), and the like of the second conductive layer 380 are not limited to this example. The second conductive layer 380 is divided, which enables to relax a thermal stress exerted on the insulating layer 360 by the second conductive layer 380.

It is also possible to divide the first conductive layer 370 into three or more portions. The division number of the first conductive layer 370 may differ from the division number of the second conductive layer 380. The minimum division number of the first conductive layer 370 is determined in view of the number, potential, and the like of the first main electrodes connected to the first conductive layer 370. In the case of the power semiconductor module 100, the first conductive layer 370 is connected to the two first main electrodes 250a and 250b having different potentials, which means that the minimum division number of the first conductive layer 370 is two. That is, it is possible to divide the first conductive layer 370 into two or more. A plurality of divided portions may be bonded to one first main electrode.

It is possible to improve the above-mentioned various effects resulting from the division as the division numbers of the conductive layers 370 and 380 increase.

<Second Preferred Embodiment>

Figure 10:
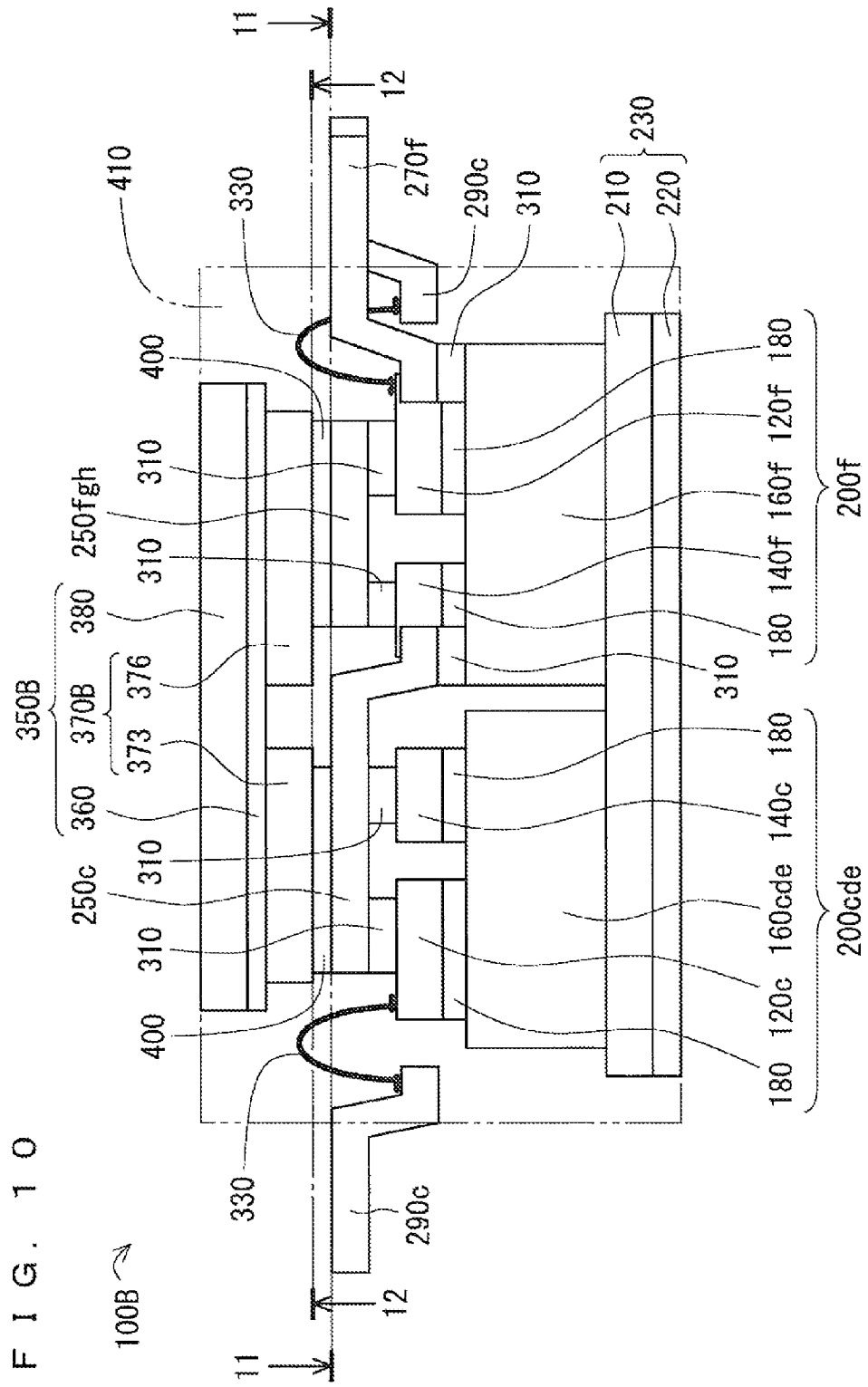
FIG. 10 is a side view of the power semiconductor module when viewed from a direction of an arrow 10 in FIG. 9.
Figure 11:
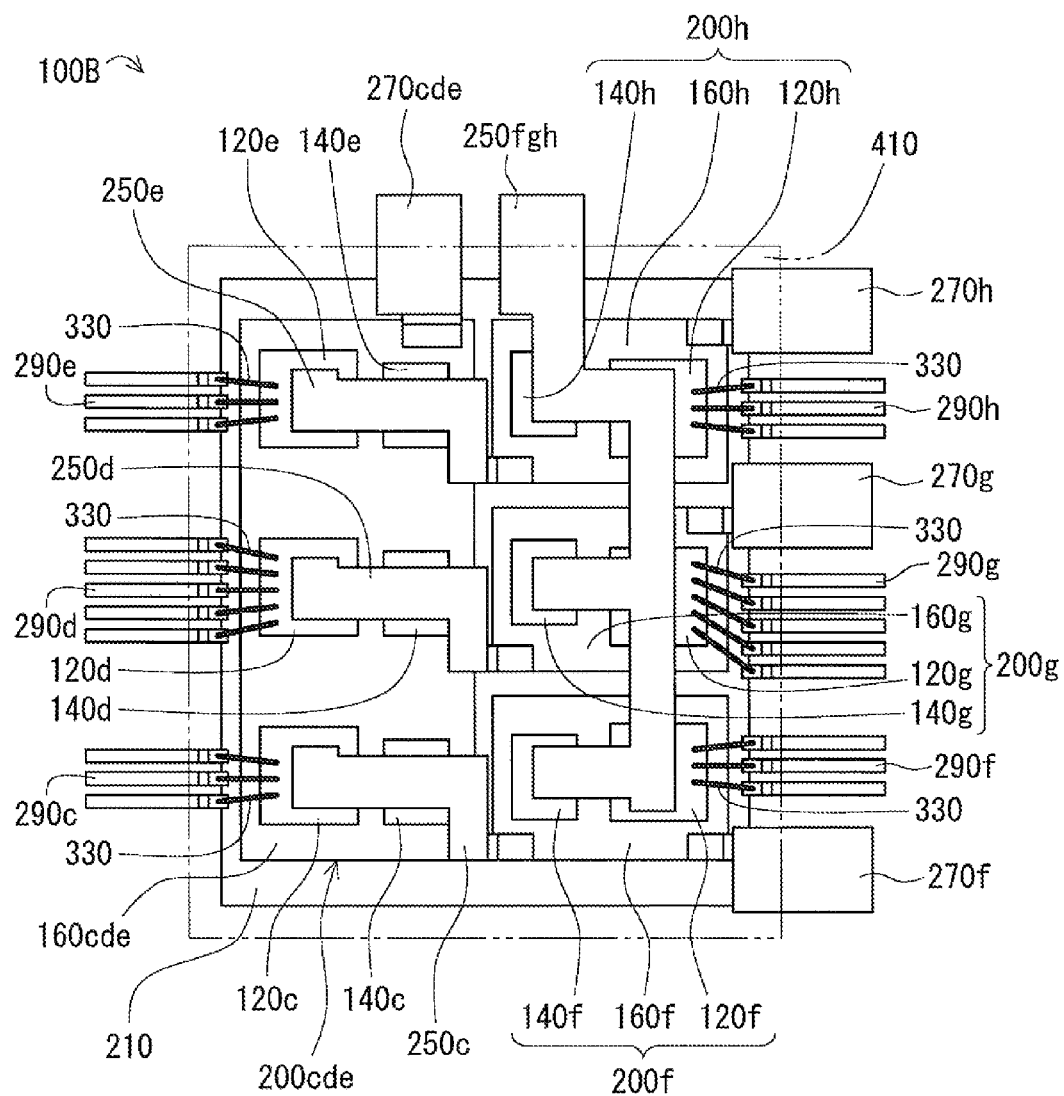
FIG. 11 is a plan view of the power semiconductor module when viewed from a direction of an arrow at a position indicated by a line 11-11 in FIG. 10.
Figure 12:
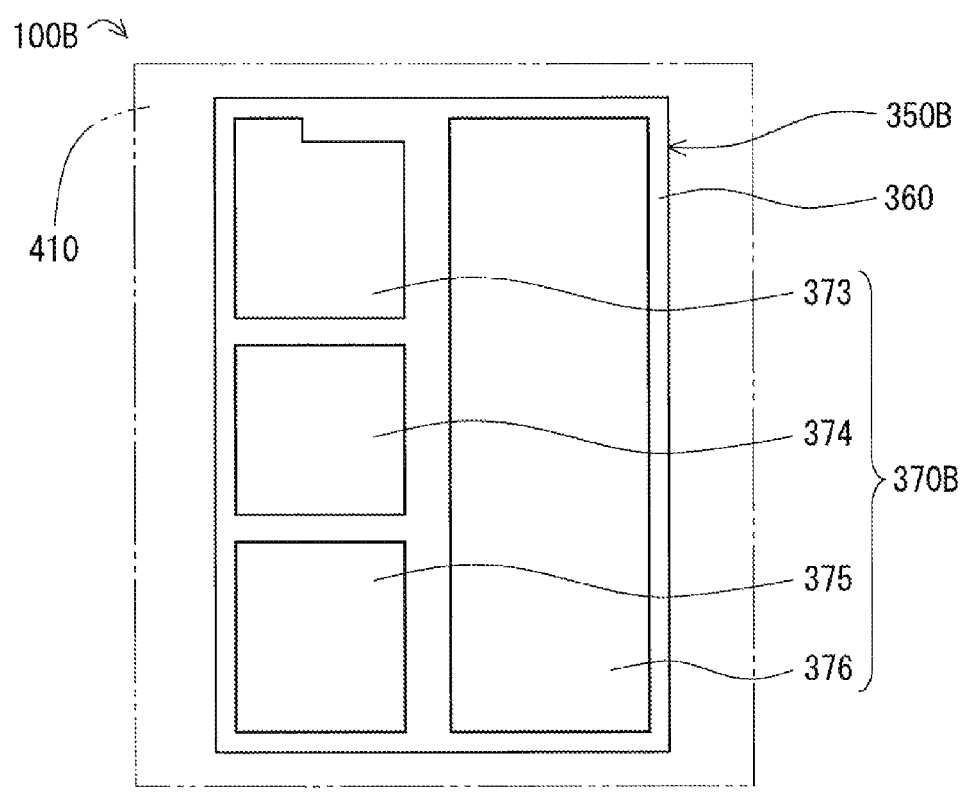
FIG. 12 is a plan view of the power semiconductor module when viewed from a direction of an arrow at a position indicated by a line 12-12 in FIG. 10.
Figure 13:
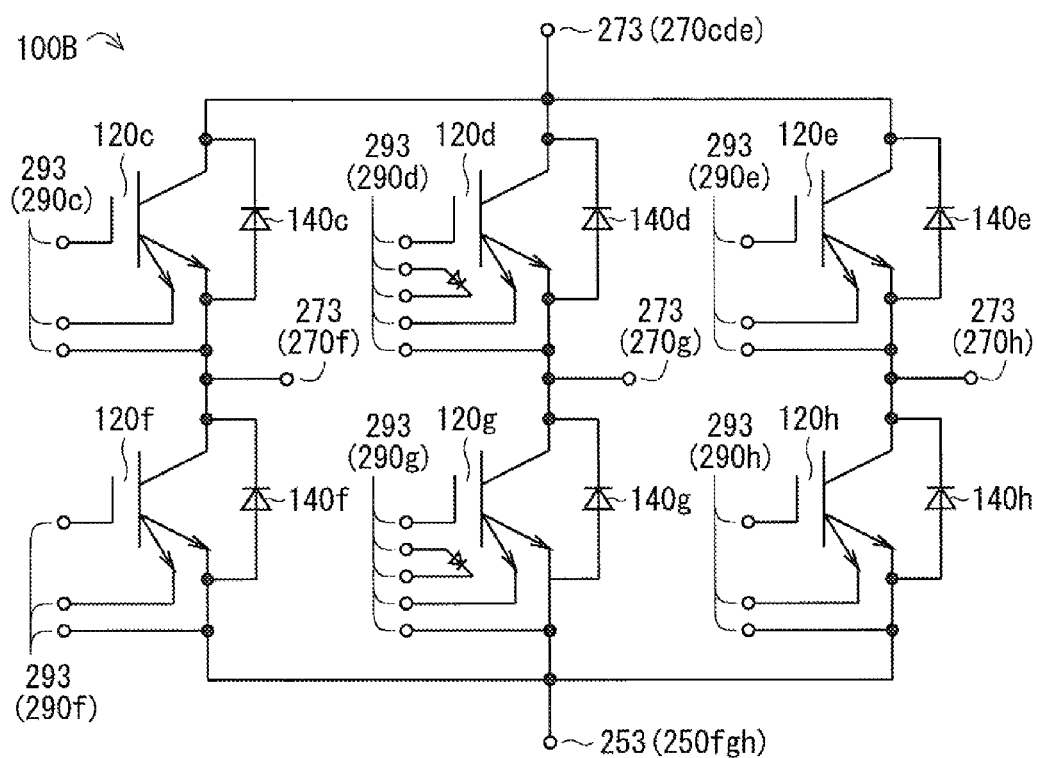
FIG. 13 is a circuit diagram of the power semiconductor module according to the second preferred embodiment.

FIGS. 9 to 12 are views showing the configuration of a power semiconductor module 100B according to a second preferred embodiment. Specifically, FIG. 9 is a plan view (top view) of the power semiconductor module 100B. FIG. 10 is a side view of the power semiconductor module 100B when viewed from a direction of an arrow 10 in FIG. 9. FIG. 11 is a plan view of the power semiconductor module 100B when viewed from a direction of an arrow at the position indicated by a line 11-11 in FIG. 10. FIG. 12 is a plan view of the power semiconductor module 100B when viewed from a direction of an arrow at the position indicated by a line 12-12 in FIG. 10. FIGS. 10 to 12 show the state in which the molding resin 410 (an external shape thereof is indicated by a chain double-dashed line for reference) is removed for the sake of description. FIG. 13 is a circuit diagram of the power semiconductor module 100B.

According to the example of FIGS. 9 to 12, the power semiconductor module 100B includes semiconductor chips 120c to 120h and 140c to 140h, heat spreaders 160cde and 160f to 160h, first electrodes 250c to 250e and 250fgh, second electrodes 270cde and 270f to 270h, third electrodes 290c to 290h, and an insulating substrate 350B.

The power semiconductor module 100B further includes the first bonding member 180, insulating sheet 210, foil-like sheet 220, second bonding member 310, wires 330, third bonding member 400, and molding resin 410 illustrated in the first preferred embodiment.

The semiconductor chips 120c to 120h are IGBT chips herein, and are configured similarly to the IGBT chips 120a and 120b illustrated in the first preferred embodiment. The semiconductor chips 140c to 140h are diode chips herein, and are configured similarly to the diode chips 140a and 140b illustrated in the first preferred embodiment. The heat spreaders 160cde and 160f to 160h are configured similarly to the heat spreaders 160a and 160b illustrated in the first preferred embodiment.

The IGBT chips 120c to 120e and the diode chips 140c to 140e are bonded to the heat spreader 160cde with the first bonding member 180. More specifically, the collector surfaces 121 (see FIG. 2) of the IGBT chips 120c to 120e and the cathode surface 141 (see FIG. 2) of the diode chips 140c to 140e are bonded to the chip-mounting surface 162 (see FIG. 2) of the heat spreader 160cde.

Similarly, the IGBT chip 120f and the diode chip 140f are bonded to the heat spreader 160f, the IGBT chip 120g and the diode chip 140g are bonded to the heat spreader 160g, and the IGBT chip 120h and the diode chip 140h are bonded to the heat spreader 160h.

The chip-mounting surfaces 162 of the heat spreaders 160cde and 160f to 160h are all in the same plane, and the heat spreaders 160cde and 160f to 160h are located on the same side with respect to the same plane. The heat spreaders 160cde and 160f to 160h are far from each other.

Here, the power semiconductor module 100B includes four unit structures 200cde, 200f, 200g, and 200h. Specifically, the unit structure 200cde has a configuration in which the semiconductor chips 120c to 120e and 140c to 140e are bonded to the heat spreader 160cde. The unit structure 200f has a configuration in which the semiconductor chips 120f and 140f are bonded to the heat spreader 160f, the unit structure 200g has a configuration in which the semiconductor chips 120g and 140g are bonded to the heat spreader 160g, and the unit structure 200h has a configuration in which the semiconductor chips 120h and 140h are bonded to the heat spreader 160h.

The insulating sheet 210 is located on the side opposite to the semiconductor chips 120c to 120h and 140a to 140h when viewed from the heat spreaders 160cde and 160f to 160h, and adhere to the lower surfaces 161 (see FIG. 2) of the heat spreaders 160cde and 160f to 160h. The foil-like sheet 220 is located on the side opposite to the heat spreaders 160cde and 160f to 160h when viewed from the insulating sheet 210, and adheres to the insulating sheet 210.

The first electrodes 250c to 250h and the second electrodes 270cde and 270f to 270h are electrodes through which a main current of the power semiconductor module 100B flows, so-called main electrodes. Basically, the main electrodes 250c to 250h, 270cde, and 270f to 270h are plate-like members having a predetermined plane pattern (see FIG. 11) similarly to the main electrodes 250a, 250b, and 270b illustrated in the first preferred embodiment.

The first main electrode 250c is an electrode bonded to the upper surfaces 122 and 142 (see FIG. 2) of the semiconductor chips 120c and 140c included in the unit structure 200cde. Specifically, the lower surface 251 (see FIG. 2) of the first main electrode 250c is bonded to the emitter electrode of the IGBT chip 120c and the anode electrode of the diode chip 140c with the second bonding member 310. Similarly, the first main electrode 250d is bonded to the emitter electrode of the IGBT chip 120d and the anode electrode of the diode chip 140d, and the first main electrode 250e is bonded to the emitter electrode of the IGBT chip 120e and the anode electrode of the diode chip 140e.

The first main electrode 250c extends into the adjacent heat spreader 160f, and the lower surface 251 of the first main electrode 250c is bonded to the chip-mounting surface 162 of the adjacent heat spreader 160f with the second bonding member 310. Similarly, the first main electrode 250d is bonded to the adjacent heat spreader 160g, and the first main electrode 250e is bonded to the adjacent heat spreader 160h.

The first main electrode 250fgh is an electrode bonded to the upper surfaces 122 and 142 (see FIG. 2) of the semiconductor chips 120f to 120h and 140f to 140h included in the unit structures 200f to 200h. Specifically, the lower surface 251 (see FIG. 2) of the first main electrode 250fgh is bonded to the emitter electrodes of the IGBT chips 120f to 120h and the anode electrodes of the diode chips 140f to 140h with the second bonding member 310.

The second main electrode 270cde is an electrode bonded to the heat spreader 160cde included in the unit structure 200cde. Specifically, the lower surface 271 (see FIG. 2) of the second main electrode 270cde is bonded to the chip-mounting surface 162 (see FIG. 2) of the heat spreader 160cde with the second bonding member 310. Similarly, the second main electrode 270f is bonded to the heat spreader 160f, the second main electrode 270g is bonded to the heat spreader 160g, and the second main electrode 270h is bonded to the heat spreader 160h.

Here, the main electrodes 250fgh, 270cde and 270f to 270h include the external terminals 253 and 273 projecting out of the molding resin 410, respectively. On the other hand, the main electrodes 250c to 250e do not include the external terminal 253.

The third electrodes 290c to 290h are electrodes used for, for example, controlling, monitoring, and managing the power semiconductor module 100B, so-called auxiliary electrodes. The third electrodes 290c to 290h are narrower than the main electrodes 250c to 250e and 250fgh (see FIG. 11).

According to the example of FIG. 11, the plurality of auxiliary electrodes 290c are respectively connected to the predetermined portions (such as the gate electrode pads, emitter electrode pads, current sensing pads for current detection, and temperature sensing pads for temperature detection) of the IGBT chip 120c with the wires 330. Similarly, the plurality of auxiliary electrodes 290d are connected to the IGBT chip 120d with the wires 330, and the plurality of auxiliary electrodes 290e are connected to the IGBT chip 120e with the wires 330. That is, the auxiliary electrodes 290c to 290e are provided to the unit structure 200cde.

Similarly, the plurality of auxiliary electrodes 290f are connected to the IGBT chip 120f with the wires 330, the plurality of auxiliary electrodes 290g are connected to the IGBT chip 120g with the wires 330, and the plurality of auxiliary electrodes 290h are connected to the IGBT chip 120h with the wires 330. That is, the auxiliary electrodes 290f, 290g, and 290h are provided to the unit structures 200f, 200g, and 200h, respectively.

The auxiliary electrodes 290c to 290h each include the external terminal 293 projecting out of the molding resin 410.

Here, the electrodes 250c to 250e, 250fgh, 270cde, 270f to 270h, and 290c to 290h are provided by a lead frame in which the patterns of the electrodes 250c to 250e, 250fgh, 270cde, 270f to 270h, and 290c to 290h are integrally formed in advance. FIG. 14 illustrates a plan view of a lead frame 500B as described above. A method of manufacturing the power semiconductor module 100B using the lead frame 500B is described below.

Referring back to FIGS. 9 to 11, the insulating substrate 350B is a plate-like member including the insulating layer 360, the first conductive layer 370B, and the second conductive layer 380. The insulating layer 360 and the second conductive layer 380 are configured as in the first preferred embodiment.

The first conductive layer 370B is configured similarly to the first conductive layer 370 illustrated in the first preferred embodiment except for that the plane pattern is different. That is, the first conductive layer 370B is divided into four portions 373 to 376 as shown in FIG. 12. The divided portion 373 is bonded to the upper surface 252 of the first main electrode 250c with the third bonding member 400. Similarly, the divided portion 374 is bonded to the first main electrode 250d, the divided portion 375 is bonded to the first main electrode 250e, and the divided portion 376 is bonded to the first main electrode 250fgh.

The molding resin 410 is provided as in the first preferred embodiment. That is, the molding resin 410 seals the unit structures 200cde, 200f, 200g, and 200h, and the wires 330 in the state in which the external terminal portions 253, 273, and 293 of the electrodes 250fgh, 270cde, 270f to 270h, and 290c to 290h, the lower surface 221 (see FIG. 2) of the foil-attached insulating member 230, and the upper surface 352 (see FIG. 2) of the insulating substrate 350 are exposed. The main electrodes 250c to 250e do not include external terminals, and thus, the whole of the main electrodes 250c to 250e is not exposed to the outside of the molding resin 410.

A cooler (not shown; in other words, heat sink) is mounted onto each of the exposed surface 221 of the foil-attached insulating member 230 and the exposed surface 352 of the insulating substrate 350 via a thermally conductive grease or the like.

With the configuration as described above, the collector electrode of the IGBT 120c and the cathode electrode of the diode 140c are connected by the heat spreader 160cde, and the emitter electrode of the IGBT 120c and the anode electrode of the diode 140c are connected by the first main electrode 250c. That is, as shown in the circuit diagram of FIG. 13, the IGBT 120c and the diode 140c are brought into anti-parallel connection. Similarly, the IGBT 120d and the diode 140d are brought into anti-parallel connection by the heat spreader 160cde and the first main electrode 250d, and the IGBT 120e and the diode 140e are brought into anti-parallel connection by the heat spreader 160cde and the first main electrode 250e.

Similarly, the IGBT 120f and the diode 140f are brought into anti-parallel connection by the heat spreader 160f and the first main electrode 250fgh, the IGBT 120g and the diode 140g are brought into anti-parallel connection by the heat spreader 160g and the first main electrode 250fgh, and the IGBT 120h and the diode 140h are brought into anti-parallel connection by the heat spreader 160h and the first main electrode 250fgh.

The first main electrode 250c is connected to the adjacent heat spreader 160f, whereby the emitter electrode of the IGBT 120c and the anode electrode of the diode 140c are connected to the collector electrode of the IGBT 120f and the cathode electrode of the diode 140f. That is, as shown in FIG. 13, the anti-parallel circuit composed of the IGBT 120c and the diode 140c is connected in series with the anti-parallel circuit composed of the IGBT 120f and the diode 140f.

Similarly, the anti-parallel circuit composed of the IGBT 120d and the diode 140d is connected in series with the anti-parallel circuit composed of the IGBT 120g and the diode 140g. The anti-parallel circuit composed of the IGBT 120e and the diode 140e is connected in series with the anti-parallel circuit composed of the IGBT 120h and the diode 140h.

The collector electrodes of the IGBTs 120c, 120d, and 120e and the cathode electrodes of the diodes 140c, 140d, and 140e are connected to each other by the heat spreader 160cde. Meanwhile, the emitter electrodes of the IGBTs 120f, 120g, and 120h and the anode electrodes of the diodes 140f, 140g, and 140h are connected to each other by the first main electrode 250fgh.

Accordingly, as shown in FIG. 13, the series circuit composed of the IGBTs 120c and 120f and the diodes 140c and 140f, the series circuit composed of the IGBTs 120d and 120g and the diodes 140d and 140g, and the series circuit composed of the IGBTs 120e and 120h and the diodes 140e and 140h are connected in parallel between the heat spreader 160cde (connected to the second main electrode 270cde) and the first main electrode 250fgh.

Provided between the external terminal 253 of the first main electrode 250fgh and the external terminal 273 of the second main electrode 270cde is a main voltage applied to the IGBTs 120c to 120h and the diodes 140c to 140h. A switch control voltage is applied to the gate electrode of the IGBT 120c from the external terminal 293 of the auxiliary electrode 290c. More specifically, the switch control voltage is applied between the external terminal 293 connected to the gate electrode of the IGBT 120c and the external terminal 293 connected to the emitter electrode of the IGBT 120c. Similarly, the switch control voltage is applied to the IGBTs 120d to 120h.

A current flows through the semiconductor chips 120c to 120h and 140c to 140h, whereby the semiconductor chips 120c to 120h and 140c to 140h generate heat. The generated heat is transferred from the lower surfaces 121 and 141 of the semiconductor chips 120c to 120h and 140c to 140h to the cooler (not shown) on the foil-like sheet 220 side through the bonding member 180, the heat spreaders 160cde and 160f to 160h, the insulating sheet 210, and the foil-like sheet 220. In addition, the generated heat is transferred from the upper surfaces 122 and 142 of the semiconductor chips 120c to 120h and 140c to 140h to the cooler (not shown) on the insulating substrate 350B side through the bonding member 310, the first main electrodes 250c to 250e and 250fgh, the bonding member 400, and the insulating substrate 350B. Accordingly, heat is dissipated by the two coolers, so that the semiconductor chips 120c to 120h and 140c to 140h are cooled.

In particular, a material having higher thermal conductivity than the molding resin 410 is adopted for the materials constituting the heat transfer paths ranging from the semiconductor chips 120c to 120h and 140c to 140h to the cooler.

As described above, the power semiconductor module 100B dissipates heat from both of the lower surfaces 121 and 141 side and the upper surfaces 122 and 142 side of the semiconductor chips 120c to 120h and 140c to 140h. For this reason, higher cooling performance can be achieved compared with the conventional configuration in which cooling is performed from only one side.

Even in a case where the cooler is made of a metal such as aluminum or copper, the power semiconductor module 100B and the cooler can be brought into contact without providing another insulating member therebetween. This is because the power semiconductor module 100B contains the insulating sheet 210 and the insulating substrate 350B.

Specifically, the heat spreaders 160cde and 160f to 160h constitute part of the main current path but are not exposed to the outside owing to the presence of the insulating sheet 210 and the molding resin 410. Therefore, insulating properties are ensured between the heat spreaders 160cde and 160f to 160h and the cooler.

The main electrodes 250fgh, 270cde, and 270f to 270h are not exposed to the outside owing to the presence of the insulating substrate 350B and the molding resin 410, except for the external terminals 253 and 273. The main electrodes 250c to 250e do not include external terminals, and thus, the whole of the main electrodes 250c to 250e is not exposed to the outside. The external terminals 253 and 273 are drawn from the surface different from the surface on which the cooler is mounted. Therefore, insulating properties are ensured between the main electrodes 250c to 250e, 250fgh, 270cde, and 270f to 270h, and the cooler.

The cooling performance is improved and insulating properties are ensured if one or both of the foil-like sheet 220 and the second conductive layer 380 of the insulating substrate 350B are not provided. Also, some of the various effects described below can be achieved if one or both of the foil-like sheet 220 and the second conductive layer 380 of the insulating substrate 350B are not provided.

The power semiconductor module 100B can be manufactured similarly to the power semiconductor module 100 according to the first preferred embodiment.

Specifically, the IGBT chips 120c to 120e and the diode chips 140c to 140e are bonded onto the heat spreader 160cde with the first bonding member 180. The IGBT chip 120f and the diode chip 140f are bonded onto the heat spreader 160f with the first bonding member 180. Similarly, the IGBT chip 120g and the diode chip 140g are bonded onto the heat spreader 160g, and the IGBT chip 120h and the diode chip 140h are bonded onto the heat spreader 160h.

Next, the semiconductor chips 120c to 120h and 140c to 140h, and the like are bonded to a lead frame 500B (see FIG. 14) in which the patterns of the electrodes 250c to 250e, 250fgh, 270cde, 270f to 270h, and 290c to 290h are integrally formed in advance.

Specifically, the first main electrode 250c in the lead frame 500B is bonded to the emitter electrode of the IGBT chip 120c, the anode electrode of the diode chip 140c, and the upper surface 162 of the heat spreader 160f with the second bonding member 310. Similarly, the first main electrode 250d in the lead frame 500B is bonded to the IGBT chip 120d, the diode chip 140d, and the heat spreader 160g, and the first main electrode 250e in the lead frame 500B is bonded to the IGBT chip 120e, the diode chip 140e, and the heat spreader 160h.

The first main electrode 250fgh in the lead frame 500B is bonded to the emitter electrodes of the IGBT chips 120f to 120h and the anode electrodes of the diode chips 140f to 140h with the second bonding member 310.

The second main electrodes 270cde and 270f to 270h in the lead frame 500B are bonded to the upper surfaces 162 of the heat spreaders 160cde, and 160f to 160h with the second bonding member 310.

With the use of the lead frame 500B, the above-mentioned portions can be bonded at the same time.

The third electrodes (auxiliary electrodes) 290e to 290h in the lead frame 500B are connected to the predetermined portions (such as the gate electrode pads, emitter electrode pads, sensing pads for current detection, and sensing pads for temperature detection of the IGBT chips 120c to 120h) with the wire 330.

After that, the first main electrodes 250c to 250e and 250fgh in the lead frame 500B and the divided portions 373 to 376 of the first conductive layer 370B of the insulating substrate 350B are bonded to each other with the third bonding member 400.

Then, the formation (half-finished product) manufactured as described above is housed in a molding die and is sealed with a molding resin. Specifically, as in the first preferred embodiment, the foil-like sheet 220 and the insulating sheet 210 are disposed in the resin injection space of the molding die, and then, the half-finished product is disposed on the insulating sheet 210. Then, the material for the molding resin 410 is poured into the resin injection space.

For example, the resin injection space of a molding die is designed so as to prevent the molding resin 410 from covering the external terminal portions 253, 273, and 293 of the electrodes 250fgh, 270cde, 270f to 270h, and 290c to 290h, the sheet surface 221 (see FIG. 2) of the foil-attached insulating sheet 230, which is located on the side far from the semiconductor chips 120c to 120h and 140c to 140h, and the substrate main surface 352 (see FIG. 2) of the insulating substrate 350B, which is located on the side far from the semiconductor chips 120c to 120h and 140c to 140h.

After sealing, the power semiconductor module 100B is cut from the lead frame 500B as in the first preferred embodiment.

With the use of the lead frame 500B as described above, the main electrodes 250c to 250e, 250fgh, 270cde, and 270f to 270h are bonded to the predetermined portions at the same time. That is, an electrical interconnection can be formed more easily compared with the manufacturing method in which separated electrodes are sequentially bonded. Further, according to the lead frame 500B, the electrodes 250fgh, 270cde, 270f to 270h, and 290c to 290h are provided as the member in which the internal connection portions (portions connected to the semiconductor chip, heat spreader, or wire) and the external terminal portions 253, 273, and 293 are integrated. For this reason, it is not required to separately provide the external terminals. This results in reductions of the number of manufacturing steps, part count, and the like, leading to a reduction of manufacturing cost.

The first conductive layer 370B of the insulating substrate 350B is divided, and the divided portions 373 to 376 are bonded to the first main electrodes 250c to 250h and 250fgh. Accordingly, the insulating properties between the main electrodes 250c to 250h and 250fgh are ensured. That is, it is not required to separately provide an insulating substrate to the main electrodes 250c to 250h and 250fgh having different potentials, and the single insulating substrate 350B is sufficient. This results in reductions of the part count, the number of manufacturing steps, and the like, leading to a reduction of manufacturing cost.

According to the single insulating substrate 350B, a flat surface can be provided easily to the cooler, which brings the insulating substrate 350B and the cooler into intimate contact with each other excellently.

According to the single insulating substrate 350B, the surface of the divided portion 373, which is bonded to the lead frame 500B, the surface of the divided portion 374, which is bonded to the lead frame 500B, the surface of the divided portion 375, which is bonded to the lead frame 500B, and the surface of the divided portion 376, which is bonded to the frame 500B, are easily caused to be all in the same plane (see the line 12-12 in FIG. 10). Meanwhile, according to the lead frame 500B, the surface of the first main electrode 250c, which is bonded to the insulating substrate 350B, the surface of the first main electrode 250d, which is bonded to the insulating substrate 350B, the surface of the first main electrode 250e, which is bonded to the insulating substrate 350B, and the surface of the first main electrode 250fgh, which is bonded to the insulating substrate 350B, are easily caused to be all in the same plane (see the line 11-11 in FIG. 10).

Therefore, the insulating substrate 350B and the first main electrodes 250c to 250h and 250fgh can be easily bonded to each other without a tilt of the insulating substrate 350B.

The insulating substrate 350B is not tilted, which prevents the formation of a gap between the upper surface 352 of the insulating substrate 350B and the inner surface of the molding die. Accordingly, the molding resin is prevented from being placed on the upper surface 352 of the insulating substrate 350B in the sealing step, so that the upper surface 352 is readily exposed.

The first conductive layer 370B of the insulating substrate 350B is divided, which increases a contact area of the lower surface 361 of the insulating layer 360 with the molding resin 410. Specifically, the region between the divided portions 373 to 376 in the lower surface 361 of the insulating layer 360 is more conducive to an increase of the contact area between the insulating layer 360 and the molding resin 410 compared with the case in which the divided portions 373 to 376 are continuous from each other. The insulating layer 360 made of resin is in more intimate contact with (in other words, has more excellent adhesion to) the molding resin 410 compared with the divided portions 373 to 376 made of metal. Accordingly, an increase of the contact area between the insulating layer 360 and the molding resin 410 can improve the insulation reliability of the insulating layer 360, the insulation reliability of the interface between the insulating layer 360 and the molding resin 410, and the like.

The first conductive layer 370B is divided, which enables to relax a thermal stress exerted on the insulating layer 360 by the first conductive layer 370B.

Figure 15:
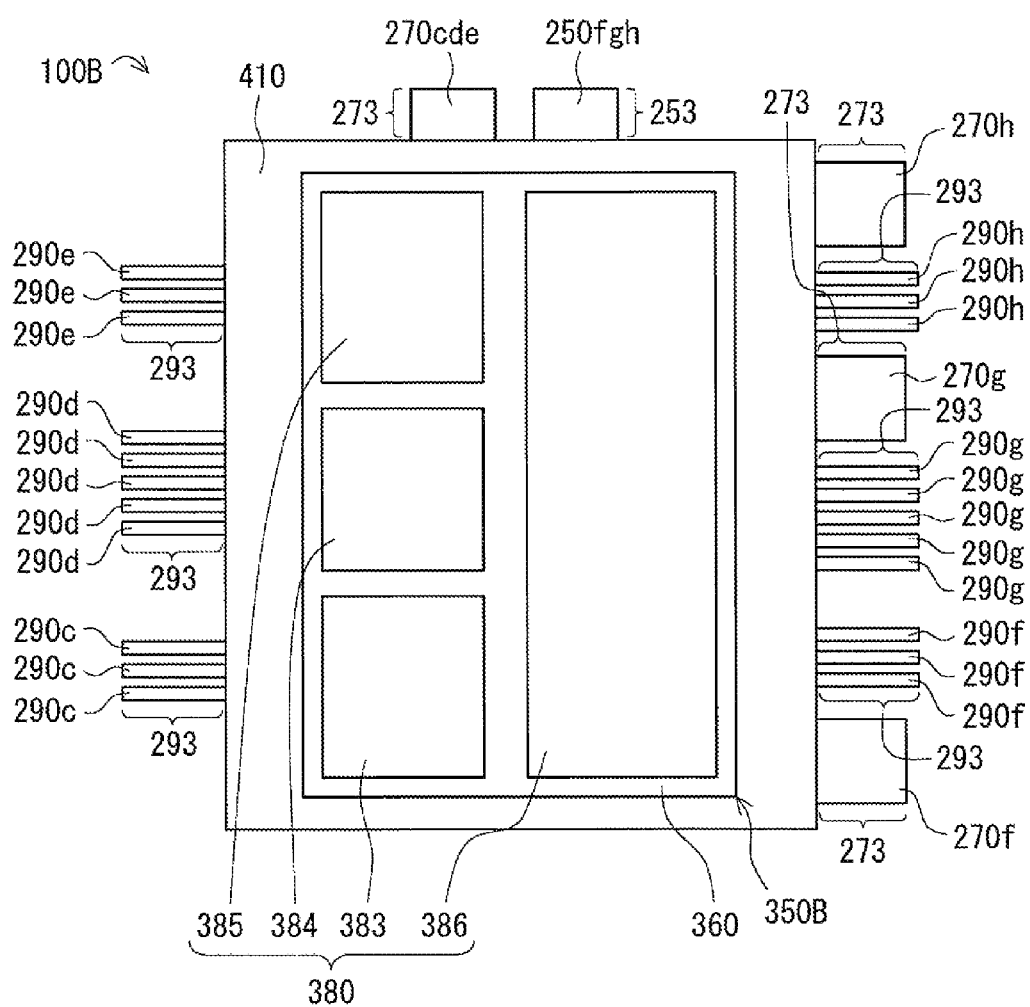
FIG. 15 is a plan view (top view) of another power semiconductor module according to the second preferred embodiment.

While the case in which the second conductive layer 380 of the insulating substrate 350B is not divided has been illustrated (see FIG. 9), the second conductive layer 380 may be divided. FIG. 15 shows an example in which the second conductive layer 380 is divided into four portions 383 to 386. In the example of FIG. 15, schematically, the divided portion 383 is provided in the region in which the divided portion 373 of the first conductive layer 370B is projected on the upper surface 362 of the insulating layer 360, and similarly, the divided portions 384 to 386 are provided in the regions in which the divided portions 374 to 376 of the first conductive layer 370B are projected on the upper surface 362 of the insulating layer 360, respectively. Note that the division number, division pattern (in other words, plane pattern), and the like of the second conductive layer 380 are not limited to this example. The second conductive layer 380 is divided, which enables to relax a thermal stress exerted on the insulating layer 360 by the second conductive layer 380.

It is also possible to divide the first conductive layer 370B into five or more portions. The division number of the first conductive layer 370B may differ from the division number of the second conductive layer 380. The minimum division number of the first conductive layer 370B is determined in view of the number, potential, and the like of the first main electrodes connected to the first conductive layer 370B. In the case of the power semiconductor module 100B, the first conductive layer 370B is connected to the four first main electrodes 250c to 250e and 250fgh having different potentials, which means that the minimum division number of the first conductive layer 370B is four. That is, it is possible to divide the first conductive layer 370B into four or more. A plurality of divided portions may be bonded to one first main electrode.

It is possible to improve the above-mentioned various effects resulting from the division as the division numbers of the conductive layers 370 and 380 increase.

<Third Preferred Embodiment>

Figure 16:
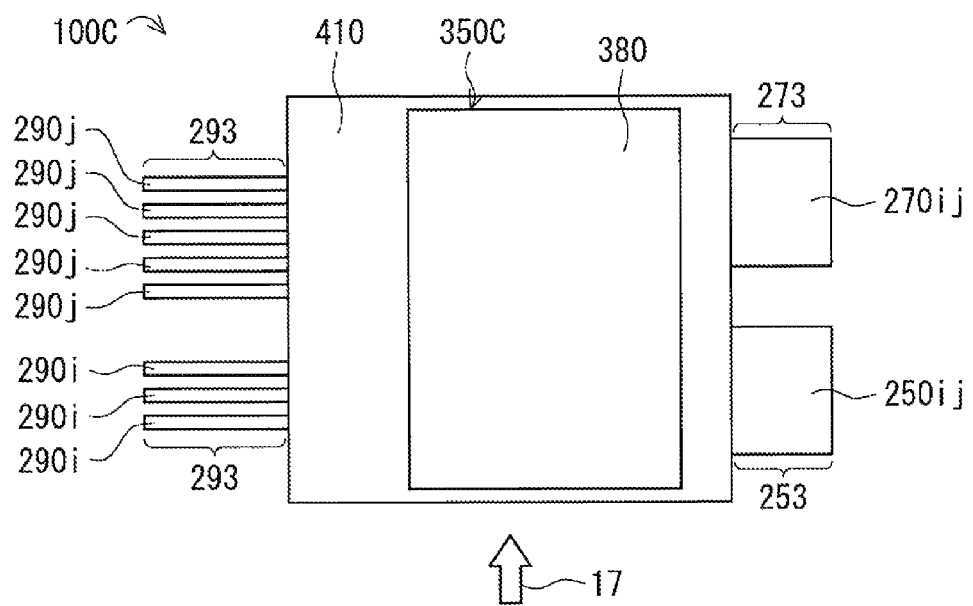
FIG. 16 is a plan view (top view) of a power semiconductor module according to a third preferred embodiment.
Figure 17:
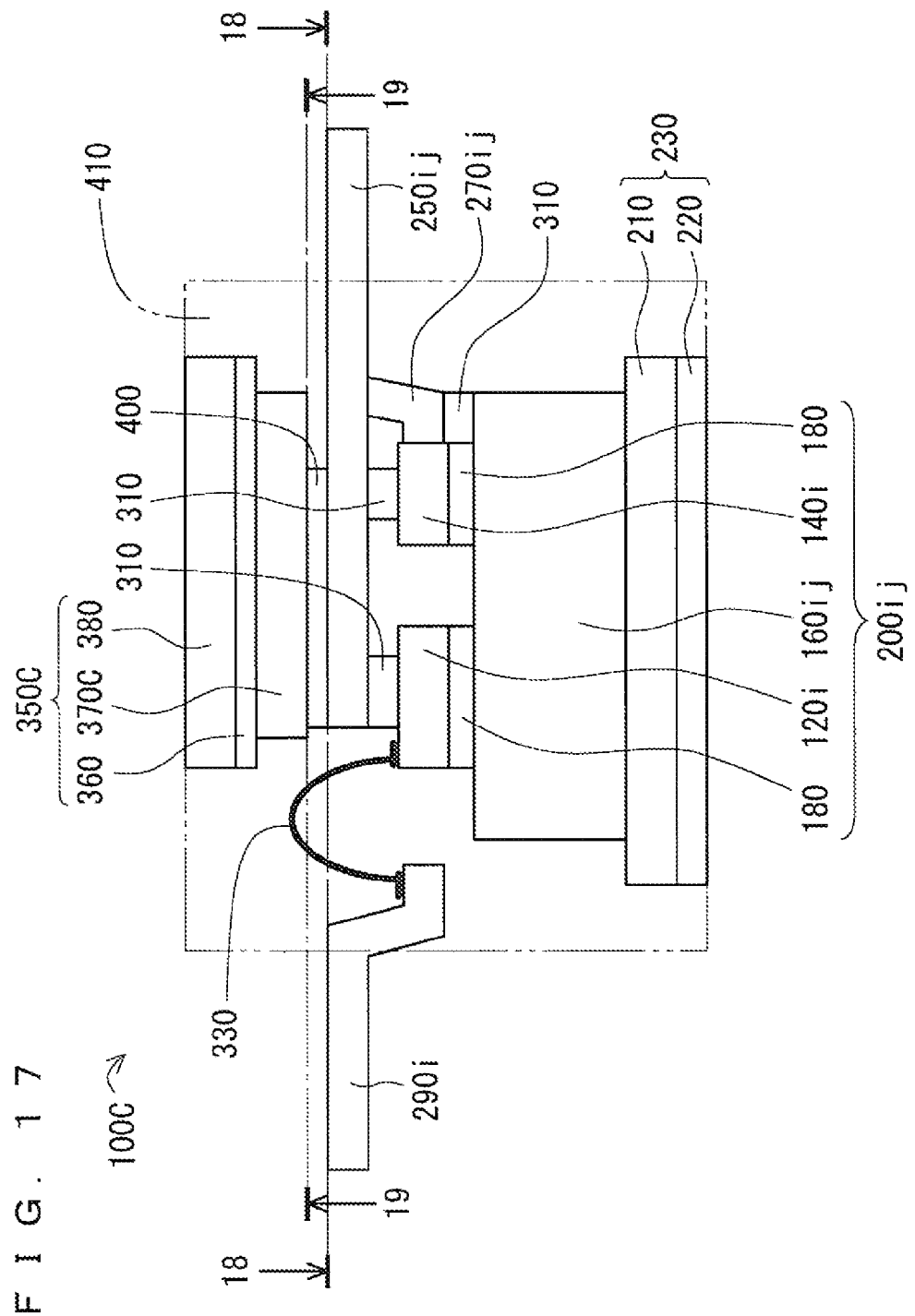
FIG. 17 is a side view of the power semiconductor module when viewed from a direction of an arrow 17 in FIG. 16.
Figure 18:
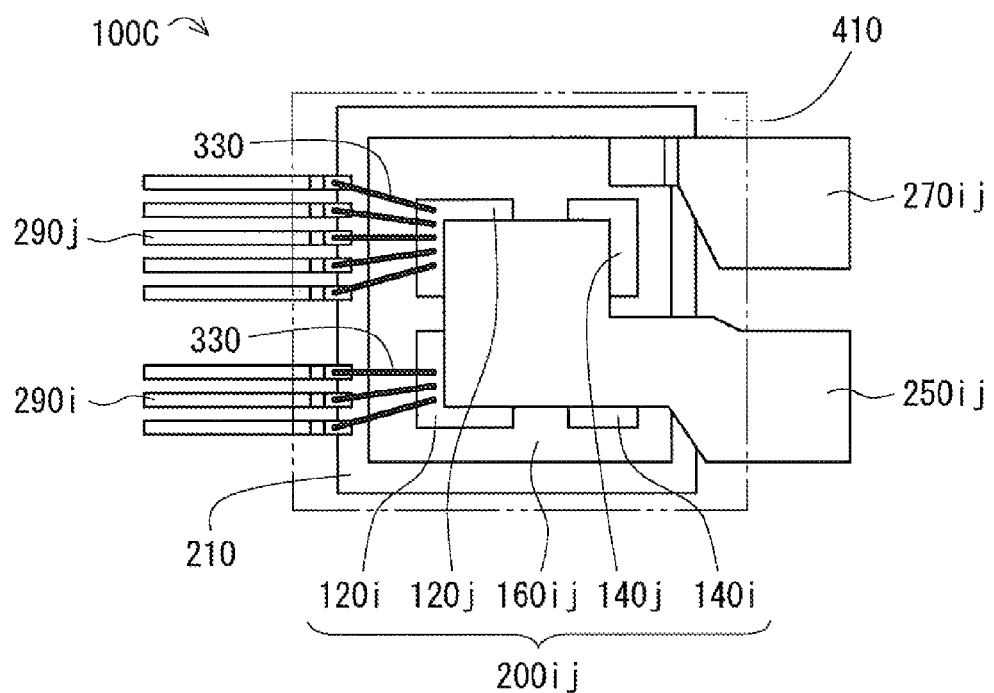
FIG. 18 is a plan view of the power semiconductor module when viewed from a direction of an arrow at a position indicated by a line 18-18 in FIG. 17.
Figure 19:
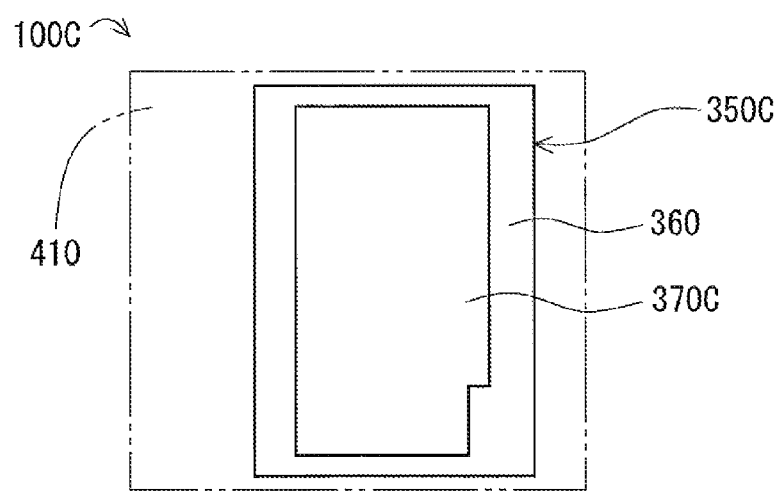
FIG. 19 is a plan view of the power semiconductor module when viewed from a direction of an arrow at a position indicated by a line 19-19 in FIG. 17.
Figure 20:
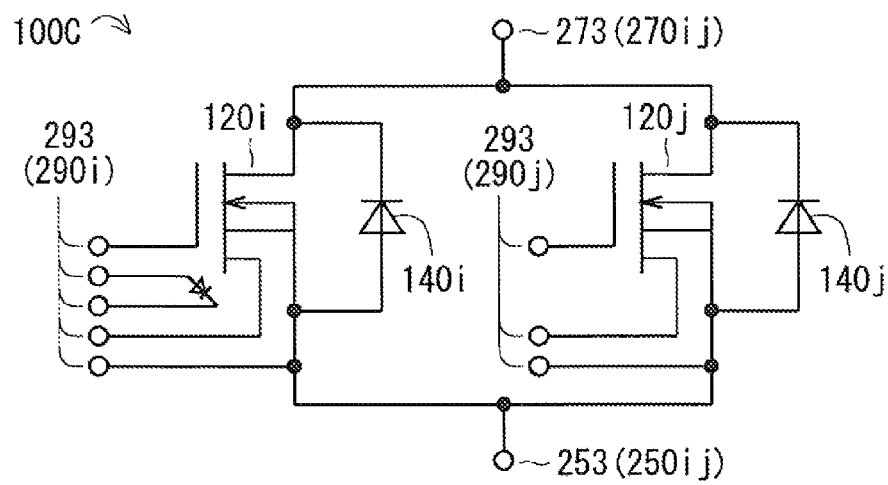
FIG. 20 is a circuit diagram of the power semiconductor module according to the third preferred embodiment.

FIGS. 16 to 19 are views showing the configuration of a power semiconductor module 100C according to a third preferred embodiment. Specifically, FIG. 16 is a plan view (top view) of the power semiconductor module 100C. FIG. 17 is a side view of the power semiconductor module 100C when viewed from a direction of an arrow 17 in FIG. 16. FIG. 18 is a plan view of the power semiconductor module 100C when viewed from a direction of an arrow at the position indicated by a line 18-18 in FIG. 17. FIG. 19 is a plan view of the power semiconductor module 100C when viewed from a direction of an arrow at the position indicated by a line 19-19 in FIG. 17. FIGS. 17 to 19 show the state in which the molding resin 410 (an external shape thereof is indicated by a chain double-dashed line for reference) is removed for the sake of description. FIG. 20 is a circuit diagram of the power semiconductor module 100C.

According to the example of FIGS. 16 to 19, the power semiconductor module 100C includes semiconductor chips 120$i$, 120$j$, 140$i$, and 140$j$, a heat spreader 160$ij$, a first electrode 250$ij$, a second electrode 270$ij$, third electrodes 290$i$ and 290$j$, and an insulating substrate 350C.

The power semiconductor module 100C further includes the first bonding member 180, insulating sheet 210, foil-like sheet 220, second bonding member 310, wires 330, third bonding member 400, and molding resin 410 illustrated in the first preferred embodiment.

Here, the semiconductor chips 120$i$ and 120$j$ are chips of metal oxide semiconductor field effect transistor (MOSFET) made of silicon carbide (SiC).

The MOSFET chip 120$i$ includes the first chip main surface 121 (see FIG. 2) and the second chip main surface 122 (see FIG. 2) which are in the relation of front and back surfaces (in other words, which are opposed to each other via a chip inside), similarly to the IGBT chips 120$a$ and 120$b$ (see FIG. 2) illustrated in the first preferred embodiment. Although detailed illustration is not provided, here, a drain electrode of the MOSFET is formed on the first chip main surface 121, and a source electrode and a gate electrode of the MOSFET are formed on the second chip main surface 122. The MOSFET chip 120$j$ is formed similarly to the MOSFET chip 120$i$.

In accordance with the above-mentioned example, in the MOSFET chips 120$i$ and 120$j$, the first chip main surface 121 and the second chip main surface 122 are also referred to as drain surface 121 and source/gate surface 122, respectively. Alternatively, the first chip main surface 121 and the second chip main surface 122 are also referred to as lower surface 121 and upper surface 122, respectively, according to the illustration of FIG. 17. Still alternatively, the MOSFET chips 120$i$ and 120$j$ are merely referred to as MOSFETs 120$i$ and 120$j$, respectively, in some cases.

The semiconductor chips 140$i$ and 140$j$ are diode chips in this case, and are configured similarly to the diode chips 140$a$ and 140$b$ illustrated in the first preferred embodiment. Note that the semiconductor chips 140$i$ and 140$j$ are chips made of silicon carbide (SiC).

The heat spreader 160$ij$ is configured similarly to the heat spreaders 160$a$ and 160$b$ illustrated in the first preferred embodiment.

The MOSFET chips 120$i$ and 120$j$ and the diode chips 140$i$ and 140$j$ are bonded to the heat spreader 160$ij$ with the first bonding member 180. More specifically, the drain surfaces 121 (see FIG. 2) of the MOSFET chips 120$i$ and 120$j$ and the cathode surfaces 141 (see FIG. 2) of the diode chips 140$i$ and 140$j$ are bonded to the chip-mounting surface 162 (see FIG. 2) of the heat spreader 160$ij$.

In this case, the power semiconductor module 100C includes one unit structure 200$ij$. Specifically, the unit structure 200$ij$ has a configuration in which the semiconductor chips 120$i$, 120$j$, 140$i$, and 140$j$ are bonded to the heat spreader 160$ij$.

The insulating sheet 210 is located on the side opposite to the semiconductor chips 120$i$, 120$j$, 140$i$, and 140$j$ when viewed from the heat spreader 160$ij$, and adhere to the lower surface 161 (see FIG. 2) of the heat spreader 160$ij$. The foil-like sheet 220 is located on the side opposite to the heat spreader 160$ij$ when viewed from the insulating sheet 210, and adheres to the insulating sheet 210.

The first electrode 250$ij$ and the second electrode 270$ij$ are electrodes through which a main current of the power semiconductor module 100C flows, so-called main electrodes. Basically, the main electrodes 250$ij$ and 270$ij$ are plate-like members having a predetermined plane pattern (see FIG. 18) similarly to the main electrodes 250$a$, 250$b$, and 270$b$ illustrated in the first preferred embodiment.

The first main electrode 250$ij$ is an electrode bonded to the upper surfaces 122 and 142 (see FIG. 2) of the semiconductor chips 120$i$, 120$j$, 140$i$, and 140$j$ included in the unit structure 200$ij$. Specifically, the lower surface 251 (see FIG. 2) of the first main electrode 250$ij$ is bonded to the source electrodes of the MOSFET chips 120$i$ and 120$j$ and the anode electrodes of the diode chips 140$i$ and 140$j$ with the second bonding member 310.

The second main electrode 270*ij* is an electrode bonded to the heat spreader 160*ij* included in the unit structure 200*ij*. Specifically, the lower surface 271 (see FIG. 2) of the second main electrode 270*ij* is bonded to the chip-mounting surface 162 (see FIG. 2) of the heat spreader 160*ij* with the second bonding member 310.

Here, the main electrodes 250*ij* and 270*ij* include the external terminals 253 and 273 projecting out of the molding resin 410, respectively.

The third electrodes 290*i* and 290*j* are electrodes used for, for example, controlling, monitoring, and managing the power semiconductor module 100C, so-called auxiliary electrodes. The third electrodes 290*i* and 290*j* are narrower than the main electrodes 250*ij* and 270*ij* (see FIG. 18).

According to the example of FIG. 18, the plurality of auxiliary electrodes 290*i* are respectively connected to the predetermined portions (such as the gate electrode pads, drain electrode pads, current sensing pads for current detection, and temperature sensing pads for temperature detection) of the MOSFET chip 120*i* with the wire 330, according to their use. Similarly, the plurality of auxiliary electrodes 290*j* are connected to the IGBT chip 120*j* with the wires 330. That is, the auxiliary electrodes 290*i* and 290*j* are provided to the unit structure 200*ij*.

The auxiliary electrodes 290*i* and 290*j* each include the external terminal 293 projecting out of the molding resin 410.

Figure 21:
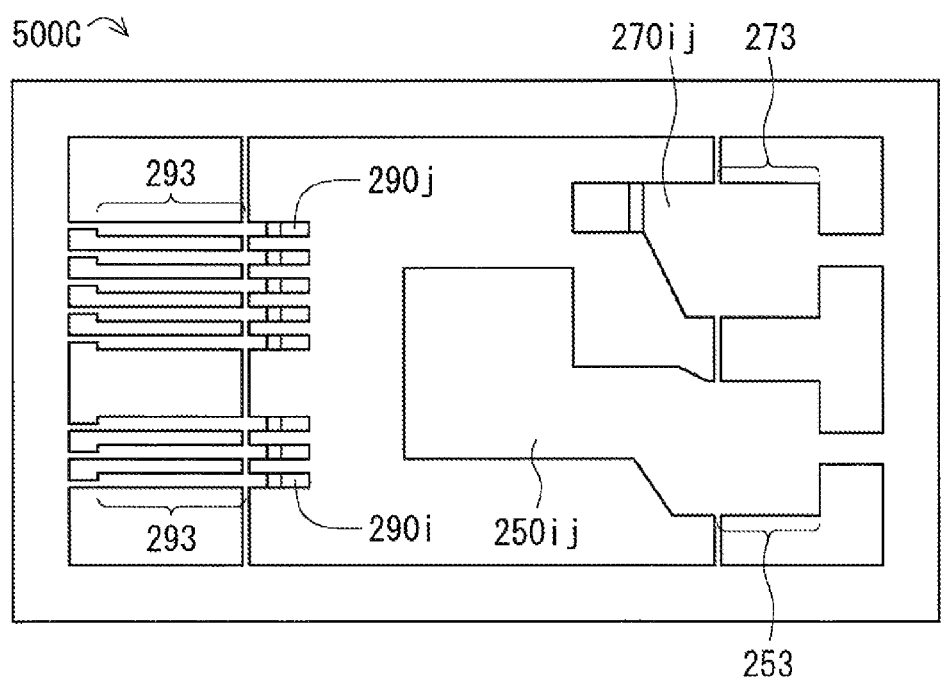
FIG. 21 is a plan view of a lead frame according to the third preferred embodiment.

Here, the electrodes 250*ij*, 270*ij*, 290*i*, and 290*j* are provided by a lead frame in which the patterns of the electrodes 250*ij*, 270*ij*, 290*i*, and 290*j* are integrally formed in advance. FIG. 21 illustrates a plan view of a lead frame 500C as described above.

Referring back to FIGS. 16 to 19, the insulating substrate 350C is a plate-like member including the insulating layer 360, the first conductive layer 370C, and the second conductive layer 380. The insulating layer 360 and the second conductive layer 380 are configured as in the first preferred embodiment.

The first conductive layer 370C is configured similarly to the first conductive layer 370 illustrated in the first preferred embodiment except for that the plane pattern is different. That is, the first conductive layer 370C is not divided as shown in FIG. 19. The first conductive layer 370C is bonded to the upper surface 252 of the first main electrode 250*ij* with the third bonding member 400.

The molding resin 410 is provided as in the first preferred embodiment. That is, the molding resin 410 seals the unit structure 200*ij* and the wire 330 in the state in which the external terminal portions 253, 273, and 293 of the electrodes 250*ij*, 270*ij*, 290*i*, and 290*j*, the lower surface 221 (see FIG. 2) of the foil-attached insulating member 230, and the upper surface 352 (see FIG. 2) of the insulating substrate 350 are exposed.

A cooler (not shown; in other words, heat sink) is mounted onto each of the exposed surface 221 of the foil-attached insulating member 230 and the exposed surface 352 of the insulating substrate 350 via a thermally conductive grease or the like.

With the configuration as described above, the drain electrodes of the MOSFETs 120*i* and 120*j* and the cathode electrodes of the diodes 140*i* and 140*j* are connected by the heat spreader 160*ij*, and the source electrodes of the MOSFETs 120*i* and 120*j* and the anode electrodes of the diodes 140*i* and 140*j* are connected by the first main electrode 250*ij*. That is, as shown in the circuit diagram of FIG. 20, the MOSFET 120*i* and the diode 140*i* are brought into anti-parallel connection, and the MOSFET 120*j* and the diode 140*j* are brought into anti-parallel connection, so that the two anti-parallel circuits are connected in parallel.

Provided between the external terminal 253 of the first main electrode 250*ij* and the external terminal 273 of the second main electrode 270*ij* is a main voltage applied to the MOSFETs 120*i* and 120*j* and the diodes 140*i* and 140*j*. A switch control voltage is applied to the gate electrode of the MOSFET 120*i* from the external terminal 293 of the auxiliary electrode 290*i*. More specifically, the switch control voltage is applied between the external terminal 293 connected to the gate electrode of the MOSFET 120*i* and the external terminal 293 connected to the source electrode of the MOSFET 120*i*. Similarly, the switch control voltage is also applied to the MOSFET 120*j*.

A current flows through the semiconductor chips 120*i*, 120*j*, 140*i*, and 140*j*, whereby the semiconductor chips 120*i*, 120*j*, 140*i*, and 140*j* generate heat. The generated heat is transferred from the lower surfaces 121 and 141 of the semiconductor chips 120*i*, 120*j*, 140*i*, and 140*j* to the cooler (not shown) on the foil-like sheet 220 side through the bonding member 180, the heat spreader 160*ij*, the insulating sheet 210, and the foil-like sheet 220. In addition, the generated heat is transferred from the upper surfaces 122 and 142 of the semiconductor chips 120*i*, 120*j*, 140*i*, and 140*j* to the cooler (not shown) on the insulating substrate 350C side through the bonding member 310, the first main electrode 250*ij*, the bonding member 400, and the insulating substrate 350C. Accordingly, heat is dissipated by the two coolers, so that the semiconductor chips 120*i*, 120*j*, 140*i*, and 140*j* are cooled.

In particular, a material having higher thermal conductivity than the molding resin 410 is adopted for the materials constituting the heat transfer paths ranging from the semiconductor chips 120*i*, 120*j*, 140*i*, and 140*j* to the cooler.

As described above, the power semiconductor module 100C dissipates heat from both of the lower surfaces 121 and 141 side and the upper surfaces 122 and 142 side of the semiconductor chips 120*i*, 120*j*, 140*i*, and 140*j*. For this reason, higher cooling performance can be achieved compared with the conventional configuration in which cooling is performed from only one side.

Even in a case where the cooler is made of a metal such as aluminum or copper, the power semiconductor module 100C and the cooler can be brought into contact without providing another insulating member therebetween. This is because the power semiconductor module 100C contains the insulating sheet 210 and the insulating substrate 350C.

Specifically, the heat spreader 160*ij* constitutes part of the main current path but is not exposed to the outside owing to the presence of the insulating sheet 210 and the molding resin 410. Therefore, insulating properties are ensured between the heat spreader 160*ij* and the cooler.

The main electrodes 250*ij* and 270*ij* are not exposed to the outside owing to the presence of the insulating substrate 350C and the molding resin 410, except for the external terminals 253 and 273. The external terminals 253 and 273 are drawn from the surface different from the surface on which the cooler is mounted. Therefore, insulating properties are ensured between the main electrodes 250*ij* and 270*ij* and the cooler.

The cooling performance is improved and insulating properties are ensured if one or both of the foil-like sheet 220 and the second conductive layer 380 of the insulating substrate 350C are not provided. Also, some of the various effects described below can be achieved if one or both of the foil-like sheet 220 and the second conductive layer 380 of the insulating substrate 350C are not provided.

The power semiconductor module 100C can be manufactured similarly to the power semiconductor modules 100 and 100B according to the first and second preferred embodiments. Although detailed description is not provided here, the lead frame 500C is used similarly to the methods of manufacturing the power semiconductor modules 100 and 100B.

With the use of the lead frame 500C, the main electrodes 250$ij$ and 270$ij$ can be bonded to the predetermined portions at the same time. That is, an electrical interconnection can be formed more easily compared with the manufacturing method in which separated electrodes are sequentially bonded. Further, according to the lead frame 500C, the electrodes 250$ij$, 270$ij$, 290$i$, and 290$j$ are provided as the member in which the internal connection portion (portion connected to the semiconductor chip, heat spreader, or wire) and the external terminal portions 253, 273, and 293 are integrated. For this reason, it is not required to separately provide the external terminals. This results in reductions of the number of manufacturing steps, part count, and the like, leading to a reduction of manufacturing cost.

As described above, the semiconductor chips 120$i$, 120$j$, 140$i$, and 140$j$ are made of silicon carbide (SiC). A semiconductor substrate made of SiC is costly, and thus, a chip size often tends to be small for improving a manufacturing yield. Accordingly, at times, SiC chips have a smaller area compared with a silicon (Si) chip and cannot cause a larger current to flow therethrough. In order to obtain a desired current amount under such constraints, it suffices that a plurality of SiC chips are connected in parallel. Specifically, in the power semiconductor module 100C, two anti-parallel circuits (each circuit is composed of a MOSFET chip and a diode chip) are connected in parallel. It is also possible to connect three or more anti-parallel circuits in parallel.

As described above, the chip number tends to increase in the power semiconductor module on which SiC chips are mounted. For example, the chip number increases further in a power semiconductor module that contains a circuit in which groups of parallel-connected SiC chips are connected in series as in the example of the first preferred embodiment, a circuit in which the above-mentioned series-connected circuits are connected in parallel as in the example of the second preferred embodiment, or the like. In view of the above, it is effective to use a lead frame.

According to the single insulating substrate 350C, a flat surface can be provided easily to the cooler, which brings the insulating substrate 350C and the cooler into intimate contact with each other excellently.

According to the single insulating substrate 350C, the surface of the first conductive layer 370C, which is bonded to the lead frame 500C, is easily made a plane (in other words, made to be flat; see a line 18-18 in FIG. 17). Meanwhile, according to the lead frame 500C, the surface of the first main electrode 250$ij$, which is bonded to the insulating substrate 350C, is easily made a plane (in other words, made to be flat; see a line 19-19 in FIG. 17).

Therefore, the insulating substrate 350C and the first main electrode 250$ij$ can be easily bonded to each other without a tilt of the insulating substrate 350C.

The insulating substrate 350C is not tilted, which prevents the formation of a gap between the upper surface 352 of the insulating substrate 350C and the inner surface of the molding die. Accordingly, the molding resin is prevented from being placed on the upper surface 352 of the insulating substrate 350C in the sealing step, so that the upper surface 352 is readily exposed.

While the configuration in which the first conductive layer 370C and the second conductive layer 380 of the insulating substrate 350C are not divided has been illustrated, it is also possible to divide one or both of the conductive layers 370C and 380 into a plurality of portions. In this case, a plurality of divided portions may be bonded to one first main electrode. The conductive layers 370C and 380 are divided, whereby it is possible to achieve various effects resulting from the division as described in the first and second preferred embodiments.

<Fourth Preferred Embodiment>

Figure 22:
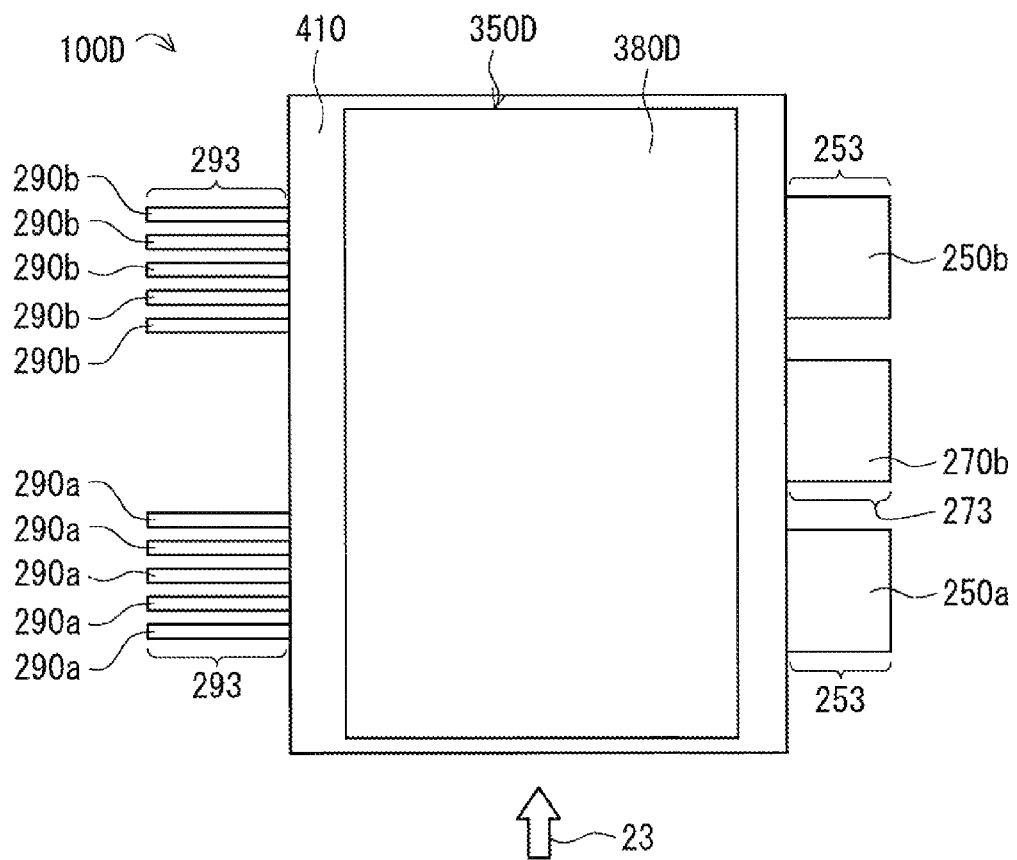
FIG. 22 is a plan view (top view) of a power semiconductor module according to a fourth preferred embodiment.
Figure 23:
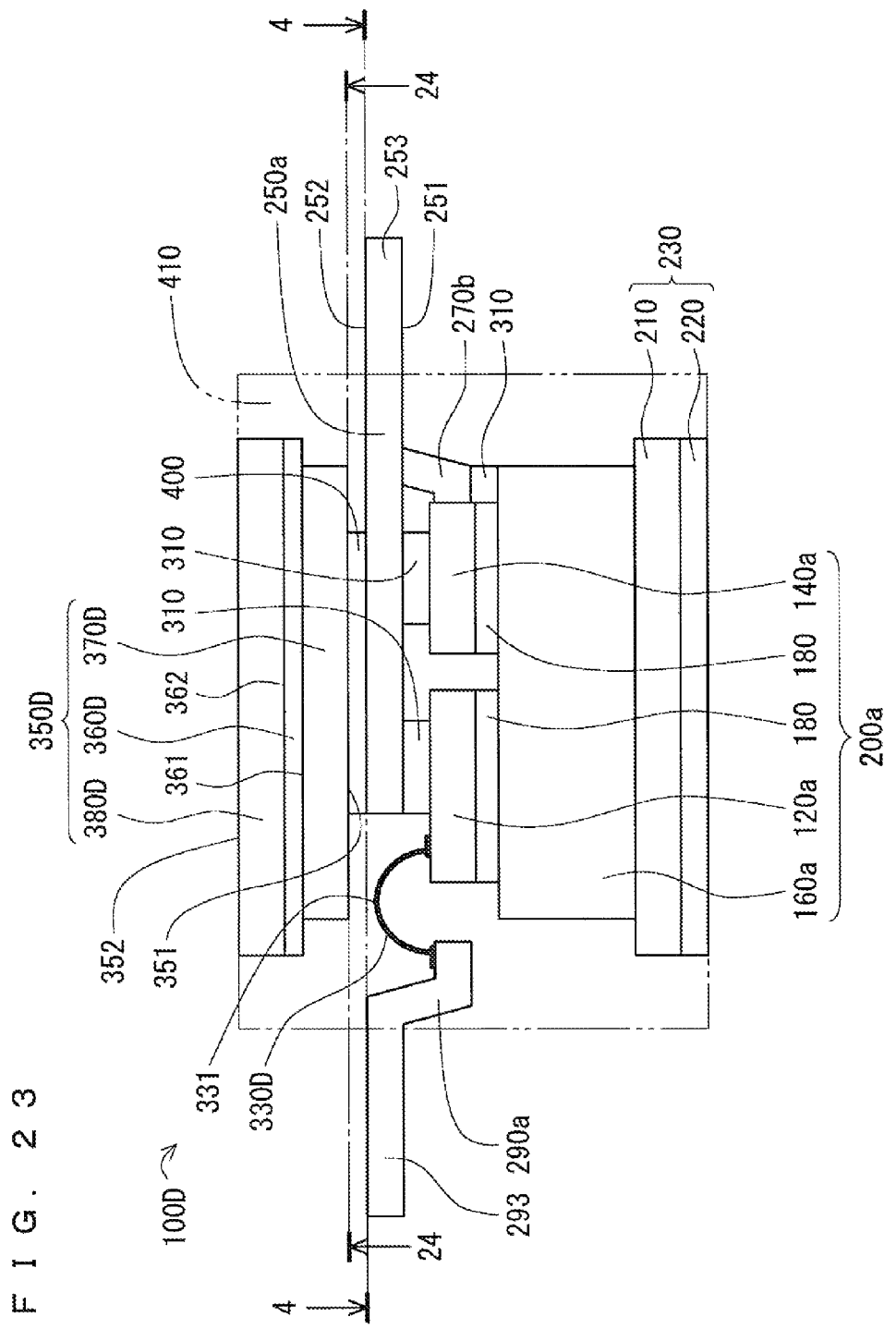
FIG. 23 is a side view of the power semiconductor module when viewed from a direction of an arrow 23 in FIG. 22.

FIGS. 22 to 24 are views showing the configuration of a power semiconductor module 100D according to a fourth preferred embodiment. Specifically, FIG. 22 is a plan view (top view) of the power semiconductor module 100D. FIG. 23 is a side view of the power semiconductor module 100D when viewed from a direction of an arrow 23 in FIG. 22. FIG. 24 is a plan view of the power semiconductor module 100D when viewed from a direction of an arrow at the position indicated by a line 24-24 in FIG. 23. FIG. 4 is also used as a plan view of the power semiconductor module 100D when viewed from an arrow at a position indicated by a line 4-4 in FIG. 23.

The power semiconductor module 100D has a configuration in which the wires 330 and the insulating substrate 350 of the power semiconductor module 100 (see FIG. 2) illustrated in the first preferred embodiment are replaced with wires 330D and an insulating substrate 350D. The other configuration of the power semiconductor module 100D is basically similar to the power semiconductor module 100 illustrated in the first preferred embodiment.

The wire 330D has a wire-loop shape in which it projects toward the insulating substrate 350D side when viewed from the heat spreaders 160$a$ and 160$b$ similarly to the wire 330 illustrated in the first preferred embodiment. However, the wire-loop shape of the wire 330D has a smaller height than the wire 330 illustrated in the first preferred embodiment. Specifically, a loop top 331 of the wire 330D is not positioned beyond the lower surface 351 of the insulating substrate 350D. In other words, the wire 330D is fit in the region on the heat spreaders 160$a$ and 160$b$ side when viewed from the insulating substrate 350D. The other respects of the wire 330D are basically similar to the wire 330 illustrated in the first preferred embodiment.

The insulating substrate 350D is configured by extending the insulating substrate 350 illustrated in the first preferred embodiment above the wire 330D in accordance with the wire 330D having a small height. That is, the insulating substrate 350D is different from the insulating substrate 350 in the size and range to be disposed but is basically similar to the insulating substrate 350 in other respects.

The insulating substrate 350D includes an insulating layer 360D and conductive layers 370D and 380D corresponding to the insulating layer 360 and the conductive layers 370 and 380 illustrated in the first preferred embodiment. In the example of FIGS. 22 to 24, not only the insulating layer 360D but also the conductive layers 370D and 380D extend above the wire 330D.

The power semiconductor module 100D can be manufactured similarly to the power semiconductor module 100 illustrated in the first preferred embodiment.

The wire 330 is made smaller in height in this manner, whereby the insulating substrate 350 can be enlarged without coming into contact with the wire 330. Accordingly, the configuration of the power semiconductor module 100D according to the fourth preferred embodiment is provided.

With the large insulating substrate 350D, a conduction area increases compared with the insulating substrate 350, leading to a reduction of thermal resistance. As a result, the power semiconductor module 100D can exhibit higher cooling performance.

The wire 330D small in height and the large insulating substrate 350D are also applicable to the second preferred embodiment and the like. Further, the shape of the wire 330D is also applicable to those other than the wires connecting the auxiliary electrodes 290a and 290b to the IGBT chips 120a and 120b, respectively.

<Fifth Preferred Embodiment>

Figure 25:
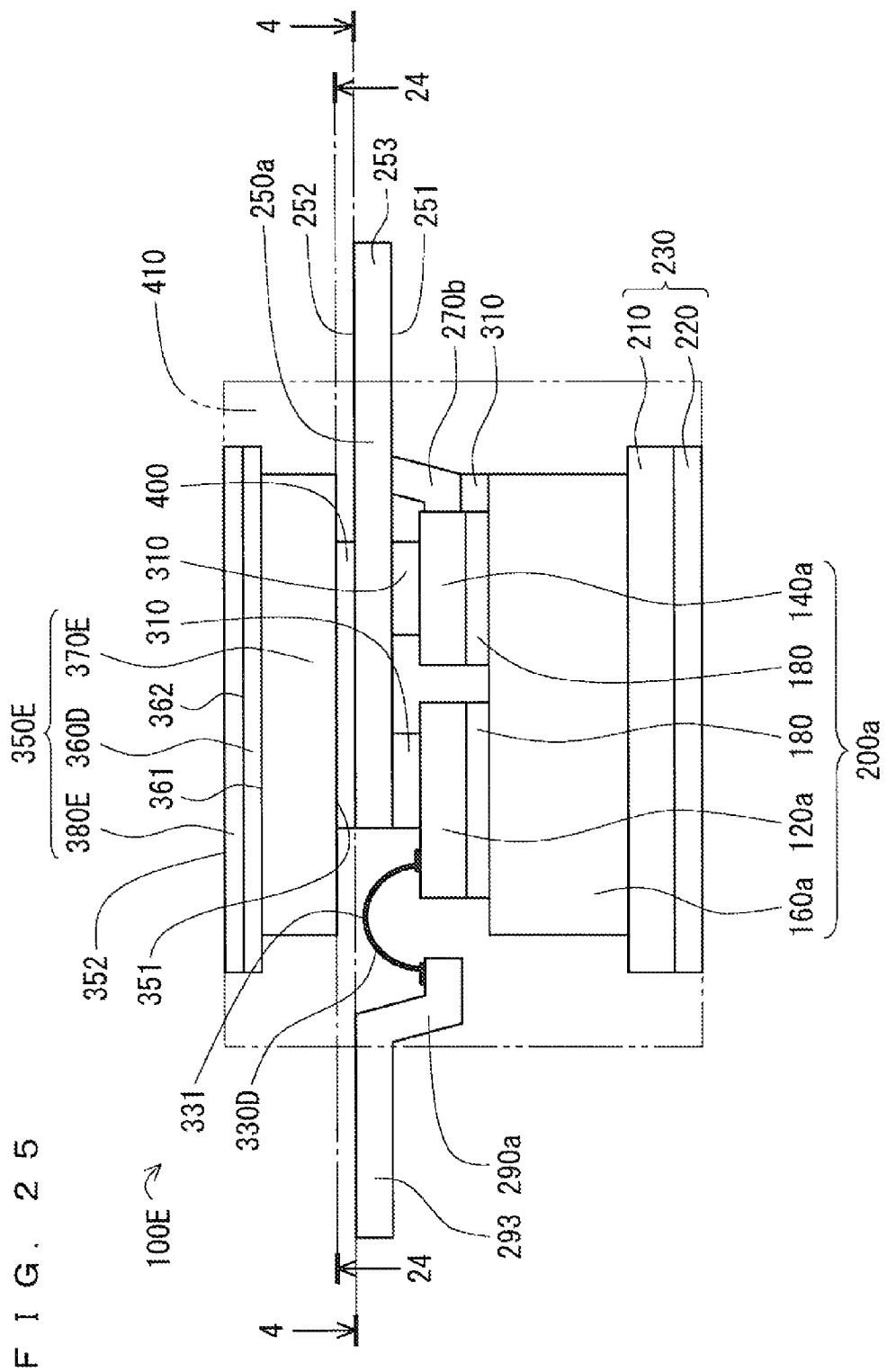
FIG. 25 is a side view of a power semiconductor module according to a fifth preferred embodiment.

FIG. 25 is a side view of a power semiconductor module 100E according to a fifth preferred embodiment. FIG. 25 corresponds to FIG. 23. FIGS. 4 and 24 are also used as plan views of the power semiconductor module 100E when viewed from the directions of the arrows at the positions indicated by the line 4-4 and line 24-24 in FIG. 25.

The power semiconductor module 100E has a configuration in which the insulating substrate 350D is replaced with an insulating substrate 350E in the power semiconductor module 100D (see FIG. 23) illustrated in the fourth preferred embodiment. The other configuration of the power semiconductor module 100E is basically similar to that of the power semiconductor module 100D.

The insulating substrate 350E includes the insulating layer 360D similar to the insulating substrate 350D, a first conductive layer 370E thicker than the first conductive layer 370D of the insulating substrate 350D, and a second conductive layer 380E thinner than the second conductive layer 380D of the insulating substrate 350D. That is, in the insulating substrate 350E, the first conductive layer 370E is thicker than the second conductive layer 380E.

The power semiconductor module 100E can be manufactured similarly to the power semiconductor module 100 illustrated in the first preferred embodiment.

According to the thick first conductive layer 370E, the area (conduction area) of the path through which the heat generated in the semiconductor chips 120a, 120b, 140a, and 140b is conducted to the insulating layer 360D can be increased. That is, the heat generated in the semiconductor chips 120a, 120b, 140a, and 140b spreads in the direction orthogonal to the thickness direction of the first conductive layer 370E while passing through the first conductive layer 370E.

The conduction area increases with respect to the heat conducted to the insulating layer 360D as described above, whereby it is possible to reduce a thermal resistance of the insulating layer 360D (having smaller thermal conductivity than the conductive layers 370E and 380E). Accordingly, the power semiconductor module 100E can exhibit higher cooling performance.

While the example in which the second conductive layer 380E is made thinner along with an increase in thickness of the first conductive layer 370E has been described, for example, the thickness of the second conductive layer 380E may be identical to that of the second conductive layer 380D (see FIG. 23) illustrated in the fourth preferred embodiment. Contrary to this, according to the example above, it is possible to prevent an increase in thickness of the entire insulating substrate 350E along with an increase in thickness of the first conductive layer 370E.

Further, the thick first conductive layer 370E can be divided into a plurality of portions, whereby the various effects resulting from the division can be achieved.

The thick first conductive layer 370E is also applicable to the first preferred embodiment and the like.

<Sixth Preferred Embodiment>

Figure 26:
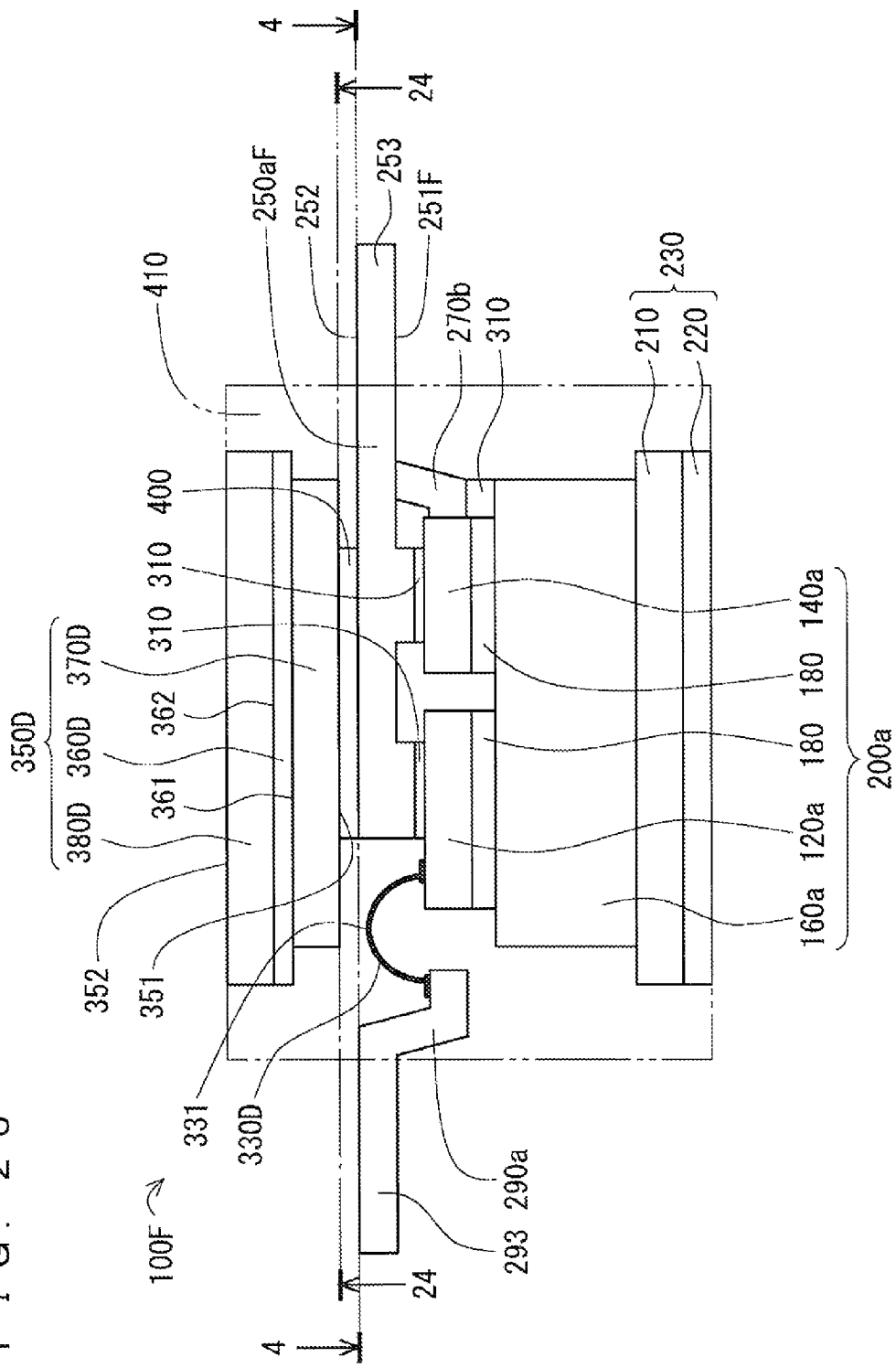
FIG. 26 is a side view of a power semiconductor module according to a sixth preferred embodiment.

FIG. 26 is a side view of a power semiconductor module 100F according to a sixth preferred embodiment. FIG. 26 corresponds to FIG. 23. FIGS. 4 and 24 are also used as plan views of the power semiconductor module 100F when viewed from the directions of the arrows at the positions indicated by the line 4-4 and the line 24-24 in FIG. 26.

The power semiconductor module 100F has a configuration in which the first main electrodes 250a and 250b have a thickness distribution in the power semiconductor module 100D (see FIG. 23) illustrated in the fourth preferred embodiment. The other configuration of the power semiconductor module 100F is basically similar to that of the power semiconductor module 100D.

FIG. 26 shows a first main electrode 250aF used in place of the first main electrode 250a but does not show a first main electrode used in place of the first main electrode 250b due to the direction of the illustration. Note that the first main electrode used in place of the first main electrode 250b also has a similar thickness distribution to that of the first main electrode 250aF.

As shown in FIG. 26, in the first main electrode 250aF, portions bonded to the semiconductor chips 120a and 140a (hereinafter, also referred to as bonding portions) are thicker than the other portions (hereinafter, also referred to as non-bonding portions). The upper surface 252 of the first main electrode 250aF is flat, whereas a lower surface 251F of the first main electrode 250aF has irregularities correspondingly to the thickness distribution. That is, the bonding portions project from the non-bonding portions in the lower surface 251F. The above-mentioned thickness distribution (in other words, surface shape of the lower surface 251F) can be formed by, for example, rolling, cutting, or the like.

The power semiconductor module 100F can be manufactured similarly to the power semiconductor module 100 illustrated in the first preferred embodiment.

According to the first main electrode 250aF, as shown in FIG. 26, it is possible to reduce the thickness of the second bonding member 310 that bonds the first main electrode 250aF and the semiconductor chips 120a and 140a. Solder or the like adopted as the second bonding member 310 has smaller thermal conductivity than a metal constituting the first main electrode 250aF. For this reason, it is possible to reduce a thermal resistance by reducing the thickness of the second bonding member 310. As a result, the power semiconductor module 100F can exhibit higher cooling performance.

According to the first main electrode 250aF, the non-bonding portions of the first main electrode 250aF can be caused to be located away from the semiconductor chips 120a and 140a. This enables to ensure insulating properties between the non-bonding portions of the first main electrode 250aF and the semiconductor chips 120a and 140a.

The first main electrode 250aF having a thickness distribution is also applicable to the first preferred embodiment and the like.

<Seventh Preferred Embodiment>

FIG. 27 is a side view of a power semiconductor module 100G according to a seventh preferred embodiment. FIG. 27 corresponds to FIG. 23. FIGS. 4 and 24 are also used as plan views of the power semiconductor module 100G when viewed from the directions of the arrows at the positions indicated by the line 4-4 and the line 24-24 in FIG. 27.

The power semiconductor module 100G has a configuration in which the third bonding member 400 is replaced with a third bonding member 400G in the power semiconductor module 100D (see FIG. 23) illustrated in the fourth preferred embodiment. The other configuration of the power semiconductor module 100G is basically similar to that of the power semiconductor module 100D.

The third bonding member 400G is a member that bonds the first main electrode 250a and the like and the insulating substrate 350D similarly to the third bonding member 400, which is formed of a material having a lower melting point than those of the other bonding members 180 and 310.

The power semiconductor module 100G can be manufactured similarly to the power semiconductor module 100 illustrated in the first preferred embodiment. In particular, effects described below can be achieved through adoption of the third bonding member 400G formed of a low-melting material.

That is, in the manufacturing step for the power semiconductor module 100G, the third bonding member 400G is used after the first bonding member 180 and the second bonding member 310. For this reason, according to the third bonding member 400G formed of a low-melting material, it is possible to prevent the existing bonding members 180 and 310 from melting in the bonding step with the use of the third bonding member 400G. Accordingly, it is possible to prevent, for example, outflow of the bonding members 180 and 310 and misalignment of the semiconductor chips 120a, 120b, 140a, and 140b. This results in improvements of yield, reliability, and the like.

The third bonding member 400G formed of a low-melting material is also applicable to the first preferred embodiment and the like.

<Modification>

The first preferred embodiment and other embodiments have described the configuration including the third electrodes (auxiliary electrodes) 290. Contrary to this, the third electrodes 290 are not provided in a power semiconductor module only including semiconductor chips (for example, diode chips) that do not require the third electrodes 290.

The preferred embodiments of the present invention can be freely combined or can be appropriately modified or omitted without departing from the scope of the present invention.

What is claimed is:

1. A power semiconductor module of resin-sealed type, comprising:
   a plurality of unit structures, each said unit structure including a plurality of semiconductor chips each having a first chip main surface and a second chip main surface, and a heat spreader having conductivity, to which said first chip main surfaces of said plurality of semiconductor chips are bonded with a first bonding member;
   an insulating member located on a side opposite to said plurality of semiconductor chips when viewed from said heat spreader;
   a plurality of electrodes including a plurality of main electrodes, each said main electrode bonded to a predetermined portion with a second bonding member, said plurality of main electrodes including a plurality of first electrodes bonded to said second chip main surfaces of predetermined chips among said plurality of semiconductor chips with said second bonding member, and a second electrode that is bonded to a chip-mounting surface of said heat spreader with said second bonding member and that projects out of said molding resin to have said external terminal portion;
   an insulating substrate including an insulating layer located on a side opposite to said plurality of semiconductor chips when viewed from said plurality of first electrodes, and a first conductive layer located between said insulating layer and said plurality of first electrodes and bonded to said plurality of first electrodes with a third bonding member; and
   a molding resin sealing said plurality of unit structures and said plurality of electrodes in a state in which a surface of said insulating member on a side far from said plurality of semiconductor chips, a surface of said insulating substrate on the side far from said plurality of semiconductor chips, and external terminal portions of said plurality of electrodes are exposed,
   wherein
   said plurality of electrodes, including said plurality of main electrodes, are provided by a lead frame in which said plurality of electrodes are formed in advance,
   said plurality of first electrodes include a series-connection-type first electrode bonded to said second chip main surface of one unit structure and bonded to said chip-mounting surface of said heat spreader of the other one or more unit structures, and
   said series-connection-type first electrode is provided by a single member cut out from said lead frame.

2. The power semiconductor module according to claim 1, wherein said plurality of first electrodes each includes a surface bonded to said first conductive layer of said insulating substrate on the same plane.

3. The power semiconductor module according to claim 1, wherein said first conductive layer of said insulating substrate is divided into a plurality of portions.

4. The power semiconductor module according to claim 3, wherein the number of said plurality of portions of said first conductive layer is equal to or larger than the number of said plurality of first electrodes.

5. The power semiconductor module according to claim 1, further comprising at least one wire protruding toward said insulating substrate side when viewed from said heat spreader and including a loop top at a position that does not reach said insulating substrate,
   wherein said insulating substrate also extends above said at least one wire.

6. The power semiconductor module according to claim 1, wherein said insulating substrate further includes a second conductive layer on a side opposite to said first conductive layer when viewed from said insulating layer, and said first conductive layer is thicker than said second conductive layer.

7. The power semiconductor module according to claim 1, wherein said plurality of first electrodes have a thickness distribution in which portions that are bonded to said plurality of semiconductor chips are thicker than portions that are not bonded to said plurality of semiconductor chips.

8. The power semiconductor module according to claim 1, wherein said third bonding member has a melting point lower than melting points of said first bonding member and said second bonding member.

9. The power semiconductor module according to claim 1, wherein said plurality of semiconductor chips include silicon carbide (SiC).

10. A method of manufacturing the power semiconductor module according to claim 1, comprising the steps of:
   (a) bonding said plurality of semiconductor chips onto said heat spreader with said first bonding member;
   (b) simultaneously bonding predetermined electrodes, including said first electrode, among said plurality of electrodes formed in said lead frame in advance to predetermined portions with said second bonding member; and
   (c) cutting said power semiconductor module from said lead frame after the said molding resin is formed.

11. The power semiconductor module according to claim 1, wherein said plurality of first electrodes include a projecting-type first electrode that projects out of said molding resin to have said external terminal portion,
said external terminal portion of said projecting-type first electrode and said external terminal portion of said second electrode are located on the same plane which is parallel to the exposed surface of said insulating member.

* * * * *